(12) United States Patent
Ou et al.

(10) Patent No.: US 9,432,063 B2
(45) Date of Patent: Aug. 30, 2016

(54) RADIO FREQUENCY SIGNAL TRANSCEIVING AND PROCESSING METHOD, DEVICE, AND BASE STATION SYSTEM

(71) Applicant: Huawei Technologies Co., Ltd., Shenzhen (CN)

(72) Inventors: Jian Ou, Shenzhen (CN); Yungang Li, Shanghai (CN); Haiqiang Sheng, Shanghai (CN); Yingjun Li, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/102,271

(22) Filed: Dec. 10, 2013

(65) Prior Publication Data

US 2014/0198831 A1 Jul. 17, 2014

Related U.S. Application Data

(63) Continuation of application No. PCT/CN2013/080955, filed on Aug. 7, 2013.

(30) Foreign Application Priority Data

Jan. 16, 2013 (CN) .......................... 2013 1 0016028

(51) Int. Cl.
*H04B 1/38* (2015.01)
*H04B 1/04* (2006.01)

(52) U.S. Cl.
CPC ..... *H04B 1/0475* (2013.01); *H04B 2001/0425* (2013.01)

(58) Field of Classification Search
CPC .................. H03F 1/3247; H03F 3/24; H03F 2201/3233; H03F 2200/451; H03F 2201/3224; H03F 1/3241; H03F 1/3282; H03F 2201/3212; H04L 27/368; H04L 27/367; H04B 1/0475; H04B 2001/0425
USPC ........................................................ 375/219
See application file for complete search history.

(56) References Cited

U.S. PATENT DOCUMENTS 6,411,825 B1 6/2002 Csapo et al.
6,983,174 B2 1/2006 Hoppenstein et al.
(Continued)

FOREIGN PATENT DOCUMENTS

CN 101316105 A 12/2008
CN 201323660 Y 10/2009
(Continued)

OTHER PUBLICATIONS

Partial English Translation and Abstract of Chinese Patent Application No. CN201854275U, Jan. 6, 2014, 5 pages.
(Continued)

*Primary Examiner* — Dhaval Patel
(74) *Attorney, Agent, or Firm* — Conley Rose, P.C.; Grant Rodolph

(57) ABSTRACT

A radio frequency signal transceiver includes: a transmission circuit configured to perform power amplification on an input first analog signal, wirelessly transmit the first analog signal after power amplification, and output the first analog signal after power amplification to a pre-distortion circuit; the pre-distortion circuit configured to convert the first analog signal after power amplification into a second analog signal and output the second analog signal, where the second analog signal is used to feedback distortion of the first analog signal to compensate the first analog signal in advance according to the distortion; and a receiving circuit configured to wirelessly receive a third analog signal, and process and output the third analog signal. The radio frequency signal transceiver can improve efficiency in receiving and transmitting a radio frequency signal, reduce a cost of a base station system, and reduce a difficulty in implementing the base station system.

17 Claims, 10 Drawing Sheets

(56) References Cited

U.S. PATENT DOCUMENTS

| | | | |
|---|---|---|---|
| 7,440,733 B2* | 10/2008 | Maslennikov et al. | 455/114.3 |
| 8,548,091 B2* | 10/2013 | Row et al. | 375/296 |
| 8,615,204 B2* | 12/2013 | Husted | 455/88 |
| 8,854,989 B2* | 10/2014 | Huang | 370/249 |
| 2002/0097811 A1* | 7/2002 | Kubo et al. | 375/296 |
| 2010/0285833 A1 | 11/2010 | Chang | |
| 2010/0297966 A1 | 11/2010 | Row et al. | |
| 2011/0170619 A1* | 7/2011 | Anvari | H04L 12/40169 375/259 |
| 2012/0083229 A1 | 4/2012 | Kenington | |
| 2014/0369442 A1 | 12/2014 | Huang | |

FOREIGN PATENT DOCUMENTS

| | | |
|---|---|---|
| CN | 101615713 A | 12/2009 |
| CN | 101888254 A | 11/2010 |
| CN | 102111195 A | 6/2011 |
| CN | 201854275 U | 6/2011 |
| CN | 102130697 A | 7/2011 |
| CN | 102186264 A | 9/2011 |
| CN | 102347779 A | 2/2012 |
| CN | 102355276 A | 2/2012 |
| CN | 103107966 A | 5/2013 |
| WO | 2012174047 A2 | 12/2012 |
| WO | WO 2012174047 A2 * | 12/2012 ........... H03F 1/3247 |

OTHER PUBLICATIONS

Foreign Communication From a Counterpart Application, PCT Application No. PCT/CN2013/080955, Chinese Search Report dated Nov. 14, 2013, 6 pages.

Foreign Communication From a Counterpart Application, PCT Application No. PCT/CN2013/080955, Chinese Written Opinion dated Nov. 14, 2013, 6 pages.

Partial English Translation and Abstract of Chinese Patent Application No. CN101615713A, Mar. 30, 2015, 15 pages.

Partial English Translation and Abstract of Chinese Patent Application No. CN102355276A, Mar. 30, 2015, 22 pages.

Yanfang, L., "Basic Theory and Application of RRU," Comba Telecom Systems Holdings Ltd, Mar. 2007, 5 pages.

Abstract of Yanfang, L., "Basic Theory and Application of RRU," Comba Telecom Systems Holdings Ltd, Apr. 7, 2015, 1 page.

Foreign Communication From a Counterpart Application, Chinese Application No. 201310016028.X, Chinese Office Action dated Feb. 17, 2015, 11 pages.

Foreign Communication From a Counterpart Application, European Application No. 13795147.1, Supplementary European Search Report dated Mar. 11, 2015, 5 pages.

Foreign Communication From a Counterpart Application, PCT Application No. 13795147.1, Extended European Search Report, Jul. 27, 2015, 13 pages.

* cited by examiner

RADIO FREQUENCY SIGNAL TRANSCEIVING AND PROCESSING METHOD, DEVICE, AND BASE STATION SYSTEM

CROSS-REFERENCE TO RELATED APPLICATIONS

This application is a continuation of International Application No. PCT/CN2013/080955, filed on Aug. 7, 2013, which claims priority to Chinese Patent Application No. 201310016028.X, filed on Jan. 16, 2013, both of which are hereby incorporated by reference in their entireties.

TECHNICAL FIELD

The present disclosure relates to the communications field, and in particular, to a radio frequency signal transceiving and processing method, device, and base station system.

BACKGROUND

A base station system is a radio signal transceiver that provides services for mobile users. The base station system includes a Baseband Unit (BBU) and a Radio Remote Unit (RRU), where the BBU and the RRU are connected by using an optical fiber, which may achieve distributed networking.

Existing RRUs have two types of structures. A first type of RRU includes a radio frequency unit, an antenna, and a radio frequency cable. The radio frequency unit includes a Common Public Radio Interface (CPRI), a Digital Analog Converter (DAC)/Analog Digital Converter (ADC), an up- and down-frequency conversion circuit, a Power Amplifier (PA), a Low Noise Amplifier (LNA), and a duplexer. The antenna includes multiple antenna oscillators, where the antenna oscillators are arranged according to a certain rule to implement spatial signal coupling. The radio frequency cable is used to connect the radio frequency unit to the antenna. Specifically, the antenna transmits a received third analog signal to the duplexer in the radio frequency unit through the radio frequency cable; the third analog signal output by the duplexer goes through the LNA, the down-frequency conversion circuit, and the ADC, and then is output to the CPRI; and the CPRI outputs the third analog signal to the BBU. Alternatively, the CPRI outputs a first analog signal received from the BBU to the duplexer through the DAC, the up-frequency conversion circuit, and the PA; the duplexer transmits the first analog signal to the antenna through the radio frequency cable; and the antenna transmits the first analog signal, and samples and trains part of the first analog signal output by the PA to perform Digital Pre-Distortion (DPD) processing. A second type of RRU includes a radio frequency unit. Multiple radio frequency units are arranged according to distances between interior antenna oscillators of an antenna to form an array, so as to satisfy gain and radiation pattern requirements of a base station antenna. The radio frequency unit includes a single antenna oscillator, a DAC/ADC, an up- and down-frequency conversion circuit, a PA, an LNA, and a duplexer. Specifically, the single antenna oscillator outputs a third analog signal to the ADC through the duplexer, the LNA, and the down-frequency conversion circuit; a high-speed digital signal output by the ADC goes through a backplane and is transmitted to a digital board for processing, and then is transmitted to the BBU. Alternatively, the digital board transmits a first analog signal received from the BBU to the DAC through the backplane; the first analog signal output by the DAC is output to the duplexer through the up-frequency conversion circuit and the PA, and then is transmitted by the duplexer to the single antenna oscillator; and the single antenna oscillator transmits the first analog signal, and samples and trains part of the first analog signal output by the PA to perform DPD processing.

In the first type of RRU structure, heat is generated when the first analog signal and the third analog signal go through the radio frequency cable, resulting in loss of the radio frequency cable, which affects efficiency of the base station system to transmit the first analog signal and to receive the third analog signal. In the second type of RRU structure, the backplane transmits the high-speed digital signal, which consumes much power, has high requirements on the backplane, and is expensive, resulting in difficult implementation manner of the base station system.

SUMMARY

In order to improve the transmission efficiency and reduce a difficulty in implementing a base station system, embodiments of the present disclosure provide a radio frequency signal transceiving and processing method, device, and base station system. The technical solutions are as follows:

According to a first aspect, an embodiment of the present disclosure provides a radio frequency signal transceiver, where the transceiver includes a transmission circuit, a pre-distortion circuit, and a receiving circuit, where the transmission circuit is configured to perform power amplification on an input first analog signal, wirelessly transmit the first analog signal after power amplification, and output the first analog signal after power amplification to the pre-distortion circuit; the pre-distortion circuit is configured to convert the first analog signal after power amplification output by the transmission circuit into a second analog signal, and output the second analog signal, where the second analog signal is used to feedback distortion of the first analog signal so as to compensate the first analog signal in advance according to the distortion; and the receiving circuit is configured to wirelessly receive a third analog signal, and process and output the third analog signal.

In a first possible implementation manner of the first aspect, the transmission circuit includes a first antenna oscillator, a first duplexer, and a power amplifier (PA), where an input end of the PA is connected to an input end of the transmission circuit, an output end of the PA is connected to an input end of the first duplexer, a duplex end of the first duplexer is connected to a duplex end of the first antenna oscillator, and a radiation end of the first antenna oscillator is connected to an output end of the transmission circuit; an input end of the pre-distortion circuit is connected to the output end of the PA; and the receiving circuit includes the first antenna oscillator, the first duplexer, and a low-noise amplifier (LNA), where the radiation end of the first antenna oscillator is connected to an input end of the receiving circuit, the duplex end of the first antenna oscillator is connected to the duplex end of the first duplexer, an output end of the first duplexer is connected to an input end of the LNA, and an output end of the LNA is connected to an output end of the receiving circuit; or, the receiving circuit includes a second antenna oscillator, a second duplexer, and the LNA, where a radiation end of the second antenna oscillator is connected to the input end of the receiving circuit, a duplex end of the second antenna oscillator is connected to a duplex end of the second duplexer, an output end of the second duplexer is connected to the input end of the LNA, and the output end of the LNA is connected to the output end of the receiving circuit.

With reference to the first possible implementation manner of the first aspect, in a second possible implementation manner, the transmission circuit further includes a first phase shifter, where an input end of the first phase shifter is connected to the input end of the transmission circuit, and an output end of the first phase shifter is connected to the input end of the PA.

With reference to the first possible implementation manner of the first aspect, in a third possible implementation manner, the transmission circuit further includes a first up-frequency conversion circuit and a first local oscillator (LO), where an input end of the first up-frequency conversion circuit is connected to the input end of the transmission circuit, a local oscillation input end of the first up-frequency conversion circuit is connected to a local oscillation output end of the first LO, and an output end of the first up-frequency conversion circuit is connected to the input end of the PA.

With reference to the third possible implementation manner of the first aspect, in a fourth possible implementation manner, the transmission circuit further includes a first phase shifter, where the output end of the first up-frequency conversion circuit is connected to an input end of the first phase shifter, and an output end of the first phase shifter is connected to the input end of the PA.

With reference to the first possible implementation manner of the first aspect, in a fifth possible implementation manner, the pre-distortion circuit includes a second up-frequency conversion circuit and a first LO, where an input end of the second up-frequency conversion circuit is connected to the output end of the PA in the transmission circuit, a local oscillation input end of the second up-frequency conversion circuit is connected to a local oscillation output end of the first LO, and an output end of the second up-frequency conversion circuit is connected to an output end of the pre-distortion circuit.

With reference to the first possible implementation manner of the first aspect, in a sixth possible implementation manner, the receiving circuit further includes a second phase shifter, where the output end of the LNA is connected to an input end of the second phase shifter, and an output end of the second phase shifter is connected to the output end of the receiving circuit.

With reference to the first possible implementation manner of the first aspect, in a seventh possible implementation manner, the receiving circuit further includes a down-frequency conversion circuit and a second LO, where the output end of the LNA is connected to an input end of the down-frequency conversion circuit, a local oscillation input end of the down-frequency conversion circuit is connected to a local oscillation output end of the second LO, and an output end of the down-frequency conversion circuit is connected to the output end of the receiving circuit.

With reference to the seventh possible implementation manner of the first aspect, in an eighth possible implementation manner, the receiving circuit further includes a second phase shifter, where the output end of the LNA is connected to an input end of the second phase shifter, and an output end of the second phase shifter is connected to the input end of the down-frequency conversion circuit.

According to a second aspect, an embodiment of the present disclosure provides a radio remote unit (RRU), where the RRU includes at least one radio frequency signal transceiver described above, and a digital circuit, where the digital circuit is configured to convert at least one input first digital signal into the corresponding number of first analog signals, and output the corresponding number of first analog signals to the corresponding number of radio frequency signal transceivers; convert a second analog signal output by at least one radio frequency signal transceiver into the corresponding number of second digital signals, and output the corresponding number of second digital signals, where the second analog signal is used to feedback distortion of the first analog signal so as to compensate the first analog signal in advance according to the distortion; and convert a third analog signal output by at least one radio frequency signal transceiver into the corresponding number of third digital signals, and output the corresponding number of third digital signals.

In a first possible implementation manner of the second aspect, the digital circuit includes a common public radio interface (CPRI) and a digital-analog converter (DAC), where the CPRI is connected to input ends of N DACs, output ends of the N DACs are separately connected to input ends of transmission circuits in N radio frequency signal transceivers; or the digital circuit includes the CPRI, the DAC, a first up-frequency conversion circuit, and a first LO, where the CPRI is connected to input ends of N DACs, output ends of the N DACs are separately connected to input ends of N first up-frequency conversion circuits, local oscillation input ends of the N first up-frequency conversion circuits are connected to a local oscillation output end of the first LO, and output ends of the N first up-frequency conversion circuits are separately connected to input ends of transmission circuits in N radio frequency signal transceivers.

In a second possible implementation manner of the second aspect, the digital circuit includes a CPRI, a DAC, and a first combiner, where the CPRI is connected to input ends of M DACs, output ends of the M DACs are connected to M input ends of the first combiner, and N output ends of the first combiner are separately connected to input ends of transmission circuits in N radio frequency signal transceivers, where M<N; or the digital circuit includes the CPRI, the DAC, the first combiner, the first up-frequency conversion circuit, and a first LO, where the CPRI is connected to input ends of M DACs, output ends of the M DACs are separately connected to input ends of M first up-frequency conversion circuits, local oscillation input ends of the M first up-frequency conversion circuits are connected to a local oscillation output end of the first LO, output ends of the M first up-frequency conversion circuits are separately connected to M input ends of the first combiner, and N output ends of the first combiner are separately connected to input ends of transmission circuits in N radio frequency signal transceivers, where M<N.

In a third possible implementation manner of the second aspect, the digital circuit includes a digital pre-distortion (DPD) interface and a first analog-digital converter (ADC), where the DPD interface is connected to output ends of N first ADCs, and input ends of the N first ADCs are separately connected to output ends of pre-distortion circuits in N radio frequency signal transceivers; or the digital circuit includes the DPD interface, the first ADC, a second up-frequency conversion circuit, and the first LO, where the DPD interface is connected to output ends of N first ADCs, input ends of the N first ADCs are separately connected to output ends of N second up-frequency conversion circuits, local oscillation input ends of the N second up-frequency conversion circuits are connected to a local oscillation output end of the first LO, and input ends of the N second up-frequency conversion circuits are separately connected to output ends of pre-distortion circuits in N radio frequency signal transceivers.

In a fourth possible implementation manner of the second aspect, the digital circuit includes a DPD interface, a first ADC, and a second combiner, where the DPD interface is connected to output ends of J first ADCs, input ends of the J first ADCs are connected to J output ends of the second combiner, and N input ends of the second combiner are separately connected to output ends of pre-distortion circuits in N radio frequency signal transceivers, where J<N; or the digital circuit includes the DPD interface, the first ADC, the second combiner, a second up-frequency conversion circuit, and a first LO, where the DPD interface is connected to output ends of J first ADCs, input ends of the J first ADCs are separately connected to output ends of J second up-frequency conversion circuits, local oscillation input ends of the J second up-frequency conversion circuits are connected to a local oscillation output end of the first LO, input ends of the J second up-frequency conversion circuits are separately connected to J output ends of the second combiner, and N input ends of the second combiner are separately connected to output ends of pre-distortion circuits in N radio frequency signal transceivers, where J<N.

In a fifth possible implementation manner of the second aspect, the digital circuit includes a DPD interface, a first ADC, and a switch, where the DPD interface is connected to an output end of the first ADC, an input end of the first ADC is connected to an output end of the switch, and N input ends of the switch are separately connected to output ends of pre-distortion circuits in N radio frequency signal transceivers; or the digital circuit includes the DPD interface, the first ADC, the switch, a second up-frequency conversion circuit, and a first LO, where the DPD interface is connected to an output end of the first ADC, an input end of the first ADC is connected to an output end of the second up-frequency conversion circuit, a local oscillation input end of the second up-frequency conversion circuit is connected to a local oscillation output end of the first LO, an input end of the second up-frequency conversion circuit is connected to an output end of the switch, and N input ends of the switch are separately connected to output ends of pre-distortion circuits in N radio frequency signal transceivers.

In a sixth possible implementation manner of the second aspect, the digital circuit includes a CPRI and a second ADC, where the CPRI is connected to output ends of N second ADCs, and input ends of the N second ADCs are separately connected to output ends of receiving circuits in N radio frequency signal transceivers; or the digital circuit includes the CPRI, the second ADC, a down-frequency conversion circuit, and a second LO, where the CPRI is connected to output ends of N second ADCs, input ends of the N second ADCs are separately connected to output ends of N down-frequency conversion circuits, local oscillation input ends of the N down-frequency conversion circuits are connected to a local oscillation output end of the second LO, and input ends of the N down-frequency conversion circuits are separately connected to output ends of receiving circuits in N radio frequency signal transceivers.

In a seventh possible implementation manner of the second aspect, the digital circuit includes a CPRI, a second ADC, and a third combiner, where the CPRI is connected to output ends of K second ADCs, input ends of the K second ADCs are connected to K output ends of the second combiner, and N input ends of the second combiner are separately connected to output ends of receiving circuits in N radio frequency signal transceivers, where K<N; or the digital circuit includes the CPRI, the second ADC, the third combiner, a down-frequency conversion circuit, and a second LO, where the CPRI is connected to output ends of K second ADCs, input ends of the K second ADCs are separately connected to output ends of K down-frequency conversion circuits, local oscillation input ends of the K down-frequency conversion circuits are connected to a local oscillation output end of the second LO, input ends of the K down-frequency conversion circuits are separately connected to K output ends of the second combiner, and N input ends of the second combiner are separately connected to output ends of receiving circuits in N radio frequency signal transceivers, where K<N.

According to a third aspect, an embodiment of the present disclosure provides a base station system, where the system includes a radio remote unit (RRU) described above, and a baseband unit (BBU); where the BBU is configured to output at least one first digital signal to the RRU, so that the RRU converts the first digital signal into a first analog signal and wirelessly transmits the first analog signal; receive at least one second digital signal output by the RRU, where the second digital signal is obtained after the RRU converts the first analog signal, and is used to feedback distortion of the first analog signal so as to compensate the first analog signal in advance according to the distortion; and receive at least one third digital signal output by the RRU, where the third digital signal is obtained after the RRU converts a wirelessly received third analog signal.

According to a fourth aspect, an embodiment of the present disclosure provides a radio frequency signal transceiving method, where the method includes performing power amplification on an input first analog signal, wirelessly transmitting the first analog signal after power amplification, and converting the first analog signal after power amplification into a second analog signal and outputting the second analog signal, where the second analog signal is used to feedback distortion of the first analog signal so as to compensate the first analog signal in advance according to the distortion; and wirelessly receiving a third analog signal, and processing and outputting the third analog signal.

In a first possible implementation manner of the fourth aspect, before the performing power amplification on a first analog signal, the method further includes performing an up-frequency conversion operation on the first analog signal; and/or performing a phase shifting operation on the first analog signal.

In a second possible implementation manner of the fourth aspect, after the converting the first analog signal after power amplification into a second analog signal, the method further includes performing an up-frequency conversion operation on the second analog signal.

In a third possible implementation manner of the fourth aspect, after the wirelessly receiving a third analog signal, the method further includes performing a down-frequency conversion operation on the third analog signal; and/or performing a phase shifting operation on the third analog signal.

According to a fifth aspect, an embodiment of the present disclosure provides a radio frequency signal processing method, where the method includes converting at least one input first digital signal into the corresponding number of first analog signals, performing power amplification on the corresponding number of first analog signals, wirelessly transmitting the first analog signal after power amplification, converting the at least one first analog signal after power amplification into the corresponding number of second analog signals, and converting the second analog signal into the corresponding number of second digital signals, where the second digital signal is used to feedback distortion of the first analog signal so as to compensate the first digital signal in advance according to the distortion; and wirelessly receiving at least one third analog signal, converting the third analog signal into the corresponding number of third digital signals, and outputting the corresponding number of third digital signals.

In a first possible implementation manner of the fifth aspect, before the performing power amplification on the corresponding number of first analog signals, the method further includes performing an up-frequency conversion operation on the first analog signal; and/or combining the first analog signal.

In a second possible implementation manner of the fifth aspect, before the converting the second analog signal into the corresponding number of second digital signals, the method further includes performing an up-frequency conversion operation on the second analog signal; and/or combining the second analog signal.

In a third possible implementation manner of the fifth aspect, before the converting the third analog signal into the corresponding number of third digital signals, the method further includes performing a down-frequency conversion operation on the third analog signal; and/or combining the third analog signal.

The technical solutions according to the embodiments of the present disclosure bring the following benefits: by wirelessly transmitting the first analog signal after power amplification, wirelessly receiving the third analog signal, and processing and outputting the third analog signal, the first analog signal can be wirelessly transmitted and the third analog signal can be wirelessly received, which avoids a radio frequency cable loss caused by resistor heating of the radio frequency cable itself when the radio frequency cable is used to transmit the first analog signal and the radio frequency cable is used to receive the third analog signal, thereby improving efficiency in receiving and transmitting a radio frequency signal; moreover, an analog signal has low requirements on transmission, hence a cost of a base station system may be reduced by transmitting the first analog signal, the second analog signal, and the third analog signal, thereby reducing a difficulty in implementing the base station system.

BRIEF DESCRIPTION OF DRAWINGS

To describe the technical solutions in the embodiments of the present disclosure more clearly, the following briefly introduces the accompanying drawings required for describing the embodiments. Apparently, the accompanying drawings in the following description show merely some embodiments of the present disclosure, and a person of ordinary skill in the art may still derive other drawings from these accompanying drawings without creative efforts.

DESCRIPTION OF EMBODIMENTS

To make the objectives, technical solutions, and advantages of the present disclosure more comprehensible, the following further describes the embodiments of the present disclosure in detail with reference to the accompanying drawings.

Embodiment 1

Figure 1:
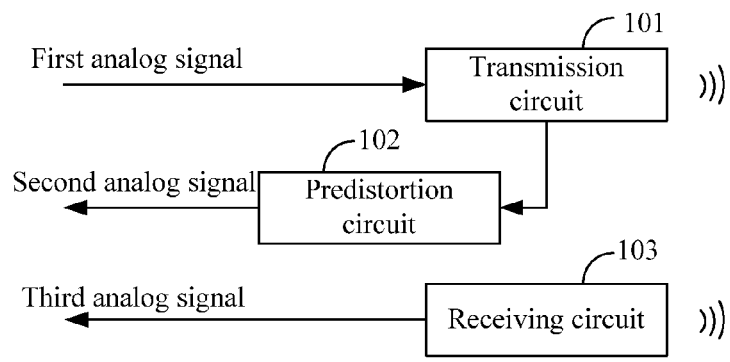
FIG. 1 is a schematic structural diagram of a radio frequency signal transceiver according to Embodiment 1 of the present disclosure.

Referring to FIG. 1, this embodiment provides a radio frequency signal transceiver, where the transceiver includes a transmission circuit 101, a pre-distortion circuit 102, and a receiving circuit 103, where the transmission circuit 101 is configured to perform power amplification on an input first analog signal, wirelessly transmit the first analog signal after power amplification, and output the first analog signal after power amplification to the pre-distortion circuit 102; the pre-distortion circuit 102 is configured to convert the first analog signal after power amplification output by the transmission circuit 101 into a second analog signal, and output the second analog signal, where the second analog signal is used to feedback distortion of the first analog signal so as to compensate the first analog signal in advance according to the distortion; and the receiving circuit 103 is configured to wirelessly receive a third analog signal, and process and output the third analog signal.

The transmission circuit 101 includes a first antenna oscillator, a first duplexer, and a PA, where an input end of the PA is connected to an input end of the transmission circuit 101, an output end of the PA is connected to an input end of the first duplexer, a duplex end of the first duplexer is connected to a duplex end of the first antenna oscillator, and a radiation end of the first antenna oscillator is connected to an output end of the transmission circuit 101.

An input end of the pre-distortion circuit 102 is connected to the output end of the PA.

The receiving circuit 103 includes the first antenna oscillator, the first duplexer, and an LNA, where the radiation end of the first antenna oscillator is connected to an input end of the receiving circuit 103, the duplex end of the first antenna oscillator is connected to the duplex end of the first duplexer, an output end of the first duplexer is connected to an input end of the LNA, an output end of the LNA is connected to an output end of the receiving circuit 103; or, the receiving circuit 103 includes a second antenna oscillator, a second duplexer, and the LNA, where a radiation end of the second antenna oscillator is connected to the input end of the receiving circuit 103, a duplex end of the second antenna oscillator is connected to a duplex end of the second duplexer, an output end of the second duplexer is connected to the input end of the LNA, and the output end of the LNA is connected to the output end of the receiving circuit 103.

The transmission circuit 101 further includes a first phase shifter, where an input end of the first phase shifter is connected to the input end of the transmission circuit 101, and an output end of the first phase shifter is connected to the input end of the PA.

The transmission circuit 101 further includes a first up-frequency conversion circuit and a first LO, where an input end of the first up-frequency conversion circuit is connected to the input end of the transmission circuit 101, a local oscillation input end of the first up-frequency conversion circuit is connected to a local oscillation output end of the first LO, and an output end of the first up-frequency conversion circuit is connected to the input end of the PA.

The transmission circuit 101 further includes a first phase shifter, where the output end of the first up-frequency conversion circuit is connected to an input end of the first phase shifter, and an output end of the first phase shifter is connected to the input end of the PA.

The pre-distortion circuit 102 includes a second up-frequency conversion circuit and a first LO, where an input end of the second up-frequency conversion circuit is connected to the output end of the PA in the transmission circuit 101, a local oscillation input end of the second up-frequency conversion circuit is connected to a local oscillation output end of the first LO, and an output end of the second up-frequency conversion circuit is connected to an output end of the pre-distortion circuit 102.

The receiving circuit 103 further includes a second phase shifter, where the output end of the LNA is connected to an input end of the second phase shifter, and an output end of the second phase shifter is connected to the output end of the receiving circuit 103.

The receiving circuit 103 further includes a down-frequency conversion circuit and a second LO, where the output end of the LNA is connected to an input end of the down-frequency conversion circuit, a local oscillation input end of the down-frequency conversion circuit is connected to a local oscillation output end of the second LO, and an output end of the down-frequency conversion circuit is connected to the output end of the receiving circuit 103.

The receiving circuit 103 further includes a second phase shifter, where the output end of the LNA is connected to an input end of the second phase shifter, and an output end of the second phase shifter is connected to the input end of the down-frequency conversion circuit.

By wirelessly transmitting the first analog signal after power amplification, wirelessly receiving the third analog signal, and processing and outputting the third analog signal, the transceiver according to this embodiment can wirelessly transmit the first analog signal and wirelessly receive the third analog signal, which avoids a radio frequency cable loss caused by resistor heating of the radio frequency cable itself when the radio frequency cable is used to transmit the first analog signal and the radio frequency cable is used to receive the third analog signal, thereby improving efficiency in receiving and transmitting a radio frequency signal; moreover, an analog signal has low requirements on transmission, hence a cost of a base station system may be reduced by transmitting the first analog signal, the second analog signal, and the third analog signal, thereby reducing a difficulty in implementing the base station system.

Embodiment 2

This embodiment provides a radio frequency signal transceiver, where the transceiver includes a transmission circuit 101, a pre-distortion circuit 102, and a receiving circuit 103, where the transmission circuit 101 is configured to perform power amplification on an input first analog signal, wirelessly transmit the first analog signal after power amplification, and output the first analog signal after power amplification to the pre-distortion circuit 102; the pre-distortion circuit 102 is configured to convert the first analog signal after power amplification output by the transmission circuit 101 into a second analog signal, and output the second analog signal, where the second analog signal is used to feedback distortion of the first analog signal so as to compensate the first analog signal in advance according to the distortion; and the receiving circuit 103 is configured to wirelessly receive a third analog signal, and process and output the third analog signal.

Figure 2:
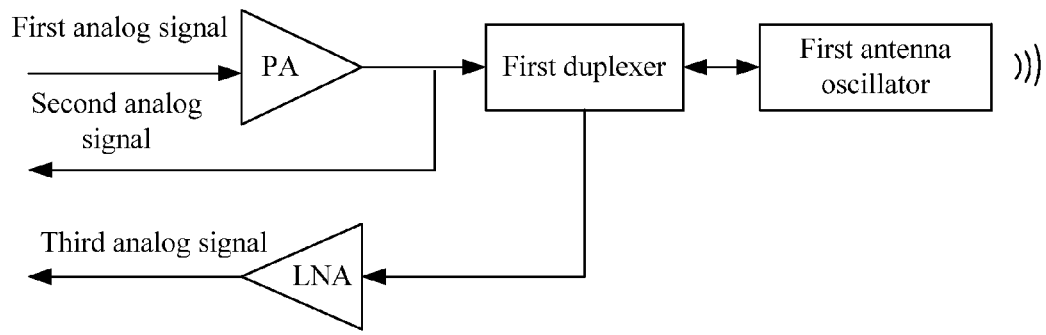
FIG. 2 is a schematic structural diagram of a first type of radio frequency signal transceiver according to Embodiment 2 of the present disclosure.

In this embodiment, refer to FIG. 2, which is a schematic structural diagram of a first type of radio frequency signal transceiver, the transmission circuit 101 may include a first antenna oscillator, a first duplexer, and a PA, where an input end of the PA is connected to an input end of the transmission circuit 101, an output end of the PA is connected to an input end of the first duplexer, a duplex end of the first duplexer is connected to a duplex end of the first antenna oscillator, and a radiation end of the first antenna oscillator is connected to an output end of the transmission circuit 101; an input end of the pre-distortion circuit 102 is connected to the output end of the PA; the receiving circuit 103 may include the first antenna oscillator, the first duplexer, and an LNA, where the radiation end of the first antenna oscillator is connected to an input end of the receiving circuit 103, the duplex end of the first antenna oscillator is connected to the duplex end of the first duplexer, an output end of the first duplexer is connected to an input end of the LNA, and an output end of the LNA is connected to an output end of the receiving circuit 103.

The transmission circuit 101 performs power amplification on the first analog signal by using the PA, so as to ensure that a receiving end within a specific area can receive a signal with proper strength without interfering with communication of a neighboring channel. The first analog signal output by the PA is transmitted to the first antenna oscillator through the first duplexer, and then the first analog signal is wirelessly transmitted by using the first antenna oscillator. The pre-distortion circuit 102 samples and trains the first analog signal output by the PA in the transmission circuit 101 to obtain the second analog signal, and outputs the second analog signal, so that the second analog signal is converted into a second digital signal to be output to the BBU. Then, the BBU specifies, according to the second digital signal, distortion of the first analog signal after being amplified by the PA, so as to compensate an output first digital signal in terms of increased gain and phase change in advance within a power change range according to a change in the output power of the PA, so that when the first analog signal converted from the first digital signal is amplified by the PA, a compensation portion may counteract a non-linear distortion portion, thereby obtaining a highly linear and non-distorted first analog signal. The receiving circuit 103 inputs a third analog signal wirelessly received by the first antenna oscillator into the first duplexer; the first duplexer outputs the third analog signal to the LNA for performing low-noise amplification processing; and then the third analog signal is output after low-noise amplification. The LNA can reduce the interference of the amplifier noise on the signal while amplifying the signal.

A filter in the first duplexer needs to filter both the first analog signal and the third analog signal; therefore, there is a high requirement on the filter. Therefore, a second antenna oscillator and a second duplexer may be added in the receiving circuit 103 to receive the third analog signal. In this case, the filter in the first duplexer only needs to filter the first analog signal, and the second duplexer only needs to filter the third analog signal, which reduces a cost of filters in the duplexers.

Figure 3:
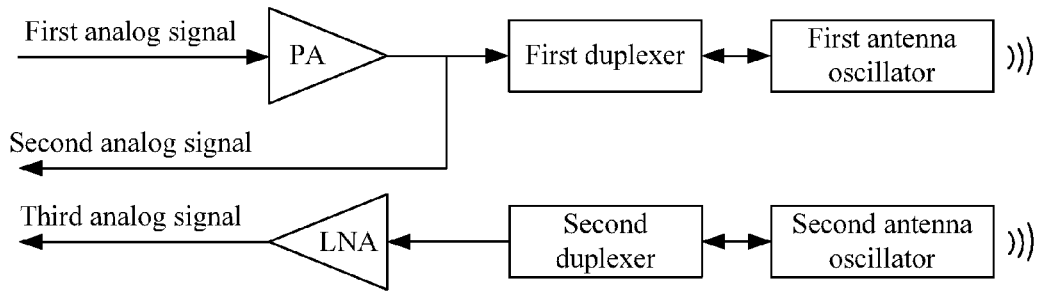
FIG. 3 is a schematic structural diagram of a second type of radio frequency signal transceiver according to Embodiment 2 of the present disclosure.

Specifically, refer to FIG. 3, which is a schematic structural diagram of a second type of radio frequency signal transceiver, the transmission circuit 101 may include a first antenna oscillator, a first duplexer, and a PA, where an input end of the PA is connected to an input end of the transmission circuit 101, an output end of the PA is connected to an input end of the first duplexer, a duplex end of the first duplexer is connected to a duplex end of the first antenna oscillator, and a radiation end of the first antenna oscillator is connected to an output end of the transmission circuit 101; an input end of the pre-distortion circuit 102 is connected to the output end of the PA; the receiving circuit 103 may include a second antenna oscillator, a second duplexer, and an LNA, where a radiation end of the second antenna oscillator is connected to an input end of the receiving circuit 103, a duplex end of the second antenna oscillator is connected to a duplex end of the second duplexer, an output end of the second duplexer is connected to an input end of the LNA, and an output end of the LNA is connected to an output end of the receiving circuit 103.

The receiving circuit 103 inputs a third analog signal wirelessly received by the second antenna oscillator into the second duplexer, and the second duplexer outputs the third analog signal to the LNA for performing low-noise amplification processing, and then outputs the third analog signal after low-noise amplification. A procedure for the transmission circuit 101 and the pre-distortion circuit 102 to process the first analog signal is the same as the procedure illustrated in FIG. 2, and is not described repeatedly herein.

Preferentially, a phase shifter may further be added in the transmission circuit 101 to simplify a structure of a combiner that is used during integration. Specifically, the transmission circuit 101 may further include a first phase shifter, where an input end of the first phase shifter is connected to the input end of the transmission circuit 101, and an output end of the first phase shifter is connected to the input end of the PA.

Figure 4:
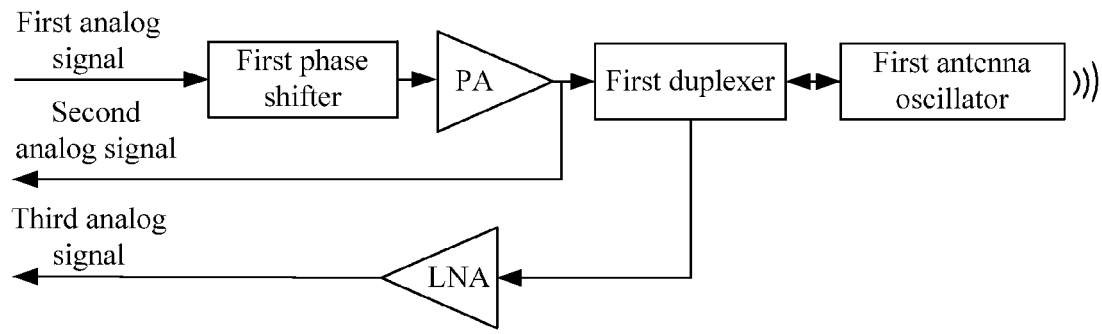
FIG. 4 is a schematic structural diagram of a third type of radio frequency signal transceiver according to Embodiment 2 of the present disclosure.

A first type of phase shifting operation on the first analog signal is applicable to the first type of radio frequency signal transceiver and the second type of radio frequency signal transceiver, where this embodiment sets no limit thereto. The first type of radio frequency signal transceiver is used as an example herein, and reference is made to a schematic structural diagram of a third type of radio frequency signal transceiver illustrated in FIG. 4.

In this embodiment, before the first analog signal is transmitted, a frequency of the first analog signal needs to be increased, so as to obtain extremely high anti-image interference capability and a very smooth frequency response within a whole frequency band, thereby facilitating spatial transmission of the first analog signal. Specifically, an up-frequency conversion operation may be performed on the first analog signal. For example, an up-frequency conversion circuit may be integrated into the digital circuit, or the up-frequency conversion circuit may be added to the radio frequency signal transceiver. When the up-frequency conversion circuit is added to the radio frequency signal transceiver, a first up-frequency conversion circuit and a first LO may be added before the PA. Specifically, the transmission circuit 101 further includes a first up-frequency conversion circuit and a first LO, where an input end of the first up-frequency conversion circuit is connected to the input end of the transmission circuit 101, a local oscillation input end of the first up-frequency conversion circuit is connected to a local oscillation output end of the first LO, and an output end of the first up-frequency conversion circuit is connected to the input end of the PA.

Figure 5:
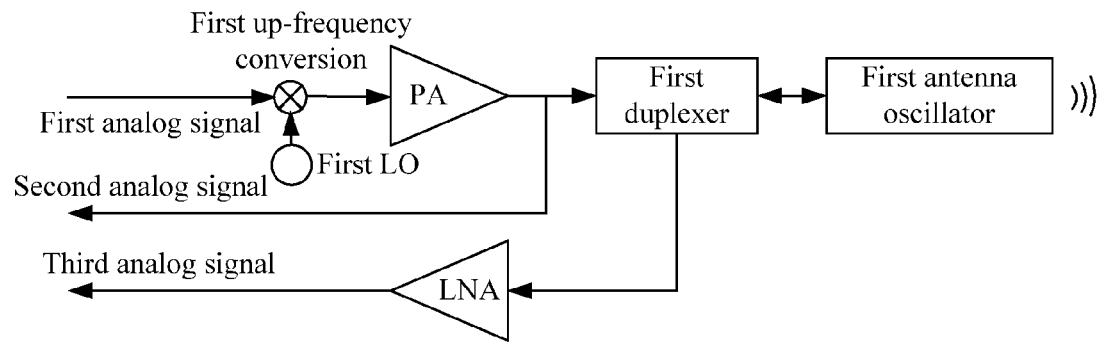
FIG. 5 is a schematic structural diagram of a fourth type of radio frequency signal transceiver according to Embodiment 2 of the present disclosure.

An up-frequency conversion operation on the first analog signal is applicable to the first type of radio frequency signal transceiver and the second type of radio frequency signal transceiver, where this embodiment sets no limit thereto. The first type of radio frequency signal transceiver is used as an example herein, and reference is made to a schematic structural diagram of a fourth type of radio frequency signal transceiver illustrated in FIG. 5.

Figure 6:
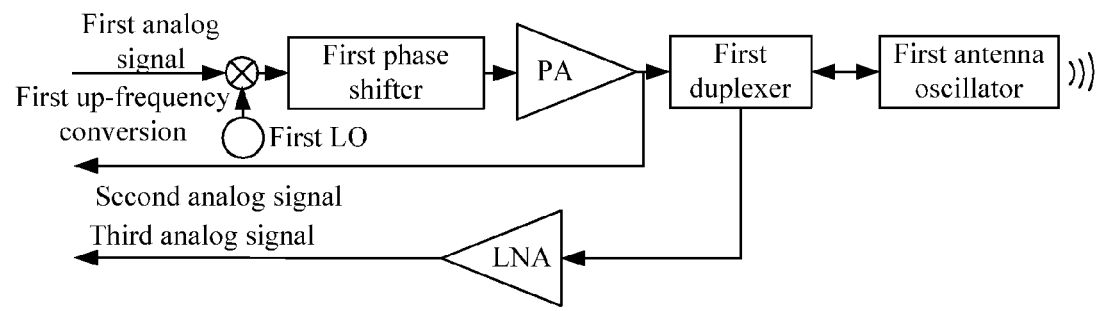
FIG. 6 is a schematic structural diagram of a fifth type of radio frequency signal transceiver according to Embodiment 2 of the present disclosure.

Correspondingly, when the up-frequency conversion operation on the first analog signal is applicable to the first type of radio frequency signal transceiver or the second type of radio frequency signal transceiver, this embodiment provides a second type of phase shifting operation on the first analog signal. Specifically, the transmission circuit 101 further includes a first phase shifter, where the output end of the first up-frequency conversion circuit is connected to an input end of the first phase shifter, and an output end of the first phase shifter is connected to the input end of the PA. For details, reference is made to a schematic structural diagram of a fifth type of radio frequency signal transceiver illustrated in FIG. 6.

Based on the same reason for adding the first up-frequency conversion circuit and the first LO to the transmission circuit 101, in this embodiment, a second up-frequency conversion circuit and a first LO may also be added to the pre-distortion circuit 102. Specifically, the pre-distortion circuit 102 may include a second up-frequency conversion circuit and a first LO, where an input end of the second up-frequency conversion circuit is connected to the output end of the PA in the transmission circuit 101, a local oscillation input end of the second up-frequency conversion circuit is connected to a local oscillation output end of the first LO, and an output end of the second up-frequency conversion circuit is connected to an output end of the pre-distortion circuit 102.

Figure 7:
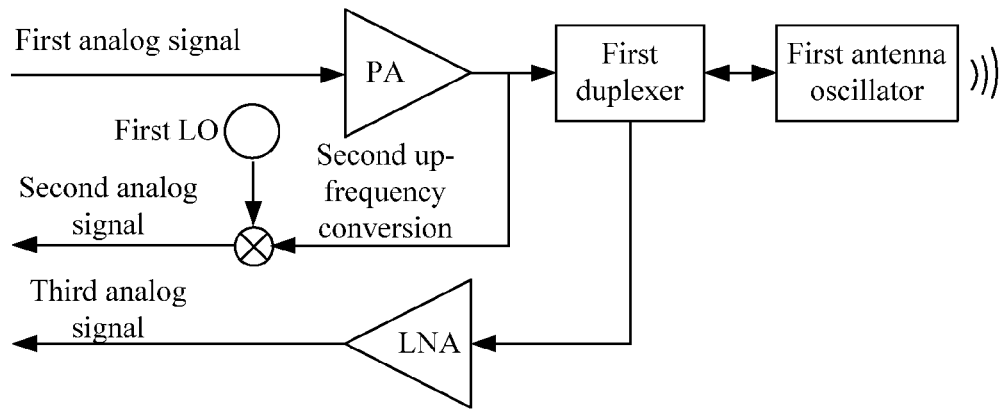
FIG. 7 is a schematic structural diagram of a sixth type of radio frequency signal transceiver according to Embodiment 2 of the present disclosure.

An up-frequency conversion operation on the second analog signal is applicable to the first type of radio frequency signal transceiver, the second type of radio frequency signal transceiver, and a solution combination of the first type of radio frequency signal transceiver or the second type of radio frequency signal transceiver with at least one operation of the up-frequency conversion on the first analog signal, the first type phase shifting on the first analog signal, and the second type of phase shifting on the first analog signal. This embodiment sets no limit thereto. The first type of radio frequency signal transceiver is used as an example herein, and reference is made to a schematic structural diagram of a sixth type of radio frequency signal transceiver illustrated in FIG. 7.

Based on the same reason for adding the first phase shifter to the transmission circuit 101, a phase shifter may also be added to the receiving circuit 103, so as to simplify a structure of a combiner that is used during integration. Specifically, the receiving circuit 103 may further include a second phase shifter, where the output end of the LNA is connected to an input end of the second phase shifter, and an output end of the second phase shifter is connected to the output end of the receiving circuit 103.

Figure 8:
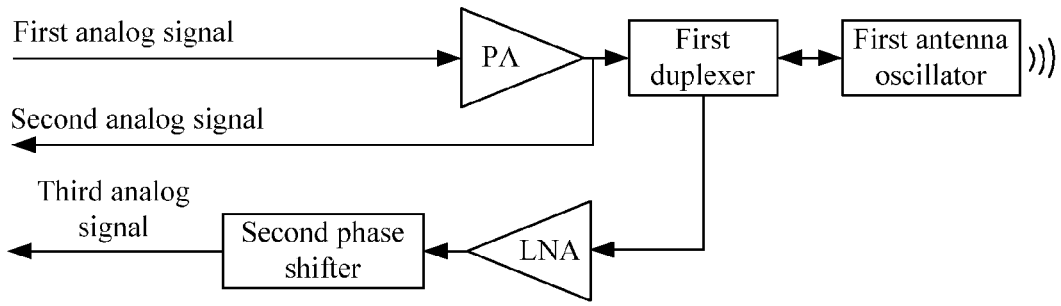
FIG. 8 is a schematic structural diagram of a seventh type of radio frequency signal transceiver according to Embodiment 2 of the present disclosure.

A first type of phase shifting operation on the third analog signal is applicable to the first type of radio frequency signal transceiver, the second type of radio frequency signal transceiver, and a solution combination of the first type of radio frequency signal transceiver or the second type of radio frequency signal transceiver with at least one operation of the up-frequency conversion on the first analog signal, the first type phase shifting on the first analog signal, the second type of phase shifting on the first analog signal, and the up-frequency conversion on the second analog signal. This embodiment sets no limit thereto. The first type of radio frequency signal transceiver is used as an example herein, and reference may be made to a schematic structural diagram of a seventh type of radio frequency signal transceiver illustrated in FIG. 8.

Based on the same reason for adding the first up-frequency conversion circuit and the first LO to the transmission circuit 101, in this embodiment, a down-frequency conversion circuit and a second LO may also be added to the receiving circuit 103, so as to convert a high-frequency signal into a low-frequency third analog signal and facilitate processing the third analog signal. Specifically, the receiving circuit 103 may further include a down-frequency conversion circuit and a second LO, where the output end of the LNA is connected to an input end of the down-frequency conversion circuit, a local oscillation input end of the down-frequency conversion circuit is connected to a local oscillation output end of the second LO, and an output end of the down-frequency conversion circuit is connected to the output end of the receiving circuit 103.

Figure 9:
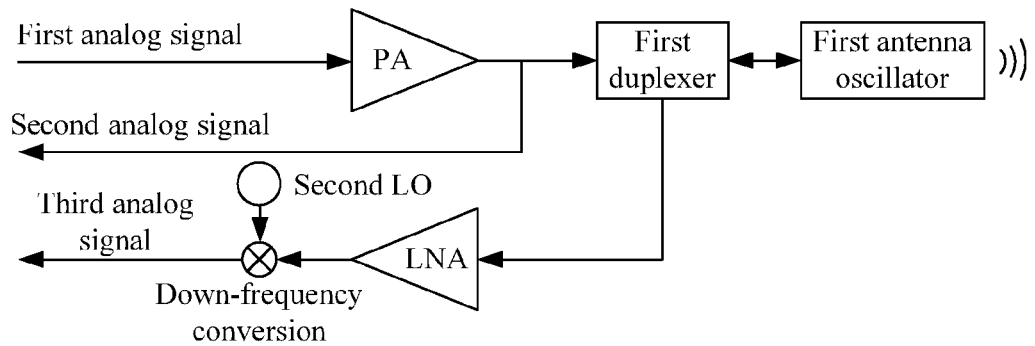
FIG. 9 is a schematic structural diagram of an eighth type of radio frequency signal transceiver according to Embodiment 2 of the present disclosure.

The down-frequency conversion operation on the third analog signal is applicable to the first type of radio frequency signal transceiver, the second type of radio frequency signal transceiver, and a solution combination of the first type of radio frequency signal transceiver or the second type of radio frequency signal transceiver with at least one operation of the up-frequency conversion on the first analog signal, the first type phase shifting on the first analog signal, the second type of phase shifting on the first analog signal, and the up-frequency conversion on the second analog signal. This embodiment sets no limit thereto. The first type of radio frequency signal transceiver is used as an example herein, and reference may be made to a schematic structural diagram of an eighth type of radio frequency signal transceiver illustrated in FIG. 9.

Correspondingly, when the down-frequency conversion operation on the third analog signal is applicable to the solutions described above, this embodiment provides a second type of phase shifting operation on the third analog signal. Specifically, the receiving circuit 103 may further include a second phase shifter, where the output end of the LNA is connected to an input end of the second phase shifter, and an output end of the second phase shifter is connected to the input end of the down-frequency conversion circuit.

Figure 10:
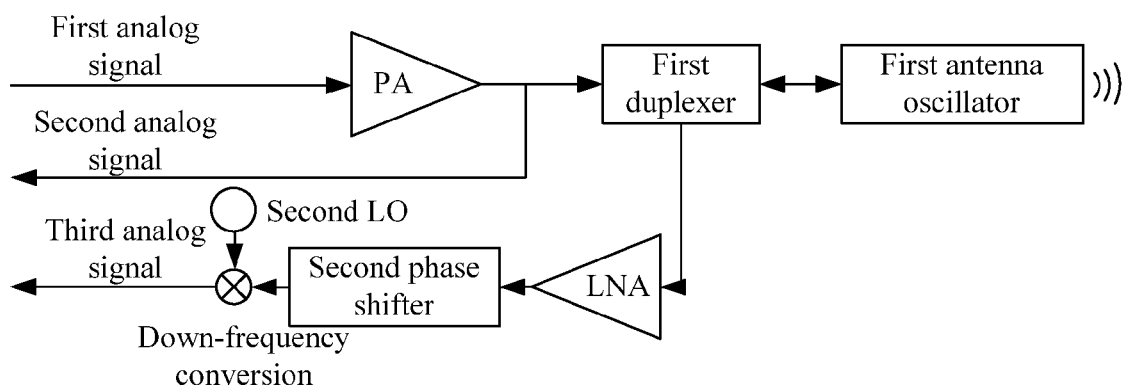
FIG. 10 is a schematic structural diagram of a ninth type of radio frequency signal transceiver according to Embodiment 2 of the present disclosure.

The second type of phase shifter solution for the third analog signal is applicable to the first type of radio frequency signal transceiver, the second type of radio frequency signal transceiver, and a solution combination of the first type of radio frequency signal transceiver or the second type of radio frequency signal transceiver with at least one operation of the up-frequency conversion on the first analog signal, the first type phase shifting on the first analog signal, the second type of phase shifting on the first analog signal, the up-frequency conversion on the second analog signal, the first type of phase shifting on the third analog signal, and the down-frequency conversion on the third analog signal. This embodiment sets no limit thereto. The first type of radio frequency signal transceiver is used as an example herein, and reference may be made to a schematic structural diagram of a ninth type of radio frequency signal transceiver illustrated in FIG. 10.

By wirelessly transmitting the first analog signal after power amplification, wirelessly receiving the third analog signal, and processing and outputting the third analog signal, the transceiver according to this embodiment can wirelessly transmit the first analog signal and wirelessly receive the third analog signal, which avoids a radio frequency cable loss caused by resistor heating of the radio frequency cable itself when the radio frequency cable is used to transmit the first analog signal and the radio frequency cable is used to receive the third analog signal, thereby improving efficiency in receiving and transmitting a radio frequency signal; moreover, an analog signal has low requirements on transmission, hence a cost of a base station system may be reduced by transmitting the first analog signal, the second analog signal, and the third analog signal, thereby reducing a difficulty in implementing the base station system.

Embodiment 3

Figure 11:
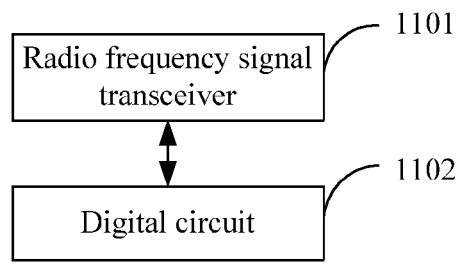
FIG. 11 is a schematic structural diagram of a first type of radio remote unit according to Embodiment 3 of the present disclosure.

Referring to FIG. 11, this embodiment provides a radio remote unit (RRU), where the RRU includes at least one radio frequency signal transceiver 1101 and a digital circuit 1102, where the digital circuit 1102 is configured to convert at least one input first digital signal into the corresponding number of first analog signals, and output the corresponding number of first analog signals to the corresponding number of radio frequency signal transceivers 1101; convert a second analog signal output by at least one radio frequency signal transceiver 1101 into the corresponding number of second digital signals, and output the corresponding number of second digital signals, where the second analog signal is used to feedback distortion of the first analog signal so as to compensate the first analog signal in advance according to the distortion; and convert a third analog signal output by at least one radio frequency signal transceiver 1101 into the corresponding number of third digital signals, and output the corresponding number of third digital signals.

An analog signal is transmitted between the radio frequency signal transceiver 1101 and the digital circuit 1102 by using a backplane, which can avoid transmitting a high-speed digital signal on the backplane, thereby reducing a quality requirement on the backplane.

In this embodiment, an up-frequency conversion circuit on the first analog signal may be added to a transmission circuit 101 of the radio frequency signal transceiver 1101, and an up-frequency conversion circuit may also be integrated into the digital circuit 1102.

In a first manner of transmitting a first analog signal, the digital circuit 1102 includes a CPRI and a DAC, where the CPRI is connected to input ends of N DACs, and output ends of the N DACs are separately connected to input ends of transmission circuits in N radio frequency signal transceivers 1101; or in a second manner of transmitting a first analog signal, the digital circuit 1102 includes a CPRI, a DAC, a first up-frequency conversion circuit, and a first LO, where the CPRI is connected to input ends of N DACs, output ends of the N DACs are separately connected to input ends of N first up-frequency conversion circuits, local oscillation input ends of the N first up-frequency conversion circuits are connected to a local oscillation output end of the first LO, and output ends of the N first up-frequency conversion circuits are separately connected to input ends of transmission circuits in N radio frequency signal transceivers 1101.

The first LO has only one local oscillation output end, and the local oscillation input ends of the N first up-frequency conversion circuits are all connected to the local oscillation output end, so as to perform the up-frequency conversion operation on the first analog signal.

Alternatively, first analog signals of different frequency bands may be sent to the radio frequency signal transceiver 1101 through a combiner, so as to save DACs and radio frequency cables in the digital circuit 1102.

In a third manner of transmitting a first analog signal, the digital circuit 1102 includes a CPRI, a DAC, and a first combiner, where the CPRI is connected to input ends of M DACs, output ends of the M DACs are connected to M input ends of the first combiner, and N output ends of the first combiner are separately connected to input ends of transmission circuits in N radio frequency signal transceivers 1101, where M<N; or in a fourth manner of transmitting a first analog signal, the digital circuit 1102 includes a CPRI, a DAC, a first combiner, a first up-frequency conversion circuit, and a first LO, where the CPRI is connected to input ends of M DACs, output ends of the M DACs are separately connected to input ends of M first up-frequency conversion circuits, local oscillation input ends of the M first up-frequency conversion circuits are connected to a local oscillation output end of the first LO, output ends of the M first up-frequency conversion circuits are separately connected to M input ends of the first combiner, and N output ends of the first combiner are separately connected to input ends of transmission circuits in N radio frequency signal transceivers 1101, where M<N.

Further, with respect to an operation of combining M signals into N (M<N) signals, this embodiment further provides a formula for calculating the N signals, which specifically is as follows:

$$n_i = \sum_{k=1}^{N} a_{i,k} \cdot m_k \quad (1)$$

where $n_i$ is a signal amplitude of a signal at an $i^{th}$ port of N; $m_k$ is a signal amplitude of a signal at a $k^{th}$ port of M; $a_{i,k}$ is a $k^{th}$ constant in a constant coefficient set of an $i^{th}$ signal of M, $0 \le i \le M-1$, $0 \le k \le N-1$, and $m_k$, $a_{i,k}$, and $n_i$ are complex numbers. When $m_k$ and $a_{i,k}$ are known, a signal amplitude each signal of the N signals may be calculated according to formula (1).

In this embodiment, an up-frequency conversion operation may be performed on the second analog signal, or no up-frequency conversion operation is performed on the second analog signal. When the up-frequency conversion operation is performed on the second analog signal, the up-frequency conversion circuit on the second analog signal may be added to the pre-distortion circuit 102 of the radio frequency signal transceiver 1101, or an up-frequency conversion circuit may be integrated into the digital circuit 1102.

In a first manner of receiving a second analog signal, the digital circuit 1102 includes a DPD interface and a first ADC, where the DPD interface is connected to output ends of N first ADCs, and input ends of the N first ADCs are separately connected to output ends of pre-distortion circuits 102 in N radio frequency signal transceivers 1101; or in a second manner of receiving a second analog signal, the digital circuit 1102 includes a DPD interface, a first ADC, a second up-frequency conversion circuit, and a first LO, where the DPD interface is connected to output ends of N first ADCs, input ends of the N first ADCs are separately connected to output ends of N second up-frequency conversion circuits, local oscillation input ends of the N second up-frequency conversion circuits are connected to a local oscillation output end of the first LO, and input ends of the N second up-frequency conversion circuit are separately connected to output ends of pre-distortion circuits 102 in the N radio frequency signal transceivers 1101.

The second up-frequency conversion circuit may perform up-frequency conversion by using the first LO, where the first LO has only one local oscillation output end, and the local oscillation input ends of the N second up-frequency conversion circuits are all connected to the local oscillation output end, so as to perform the up-frequency conversion operation on the second analog signal.

Alternatively, second analog signals of different frequency bands that are sent by the radio frequency signal transceiver 1101 may be received using a combiner, so as to save first ADCs and radio frequency cables in the digital circuit 1102.

In a third manner of receiving a second analog signal, the digital circuit 1102 includes a DPD interface, a first ADC, and a second combiner, where the DPD interface is connected to output ends of J first ADCs, input ends of the J first ADCs are connected to J output ends of the second combiner, and N input ends of the second combiner are separately connected to output ends of pre-distortion circuits 102 in N radio frequency signal transceivers 1101, where J<N; or in a fourth manner of receiving a second analog signal, the digital circuit 1102 includes a DPD interface, a first ADC, a second combiner, a second up-frequency conversion circuit, and a first LO, where the DPD interface is connected to output ends of J first ADCs, input ends of the J first ADCs are separately connected to output ends of J second up-frequency conversion circuits, local oscillation input ends of the J second up-frequency conversion circuits are connected to a local oscillation output end of the first LO, input ends of the J second up-frequency conversion circuits are separately connected to J output ends of the second combiner, and N input ends of the second combiner are separately connected to output ends of pre-distortion circuits 102 in N radio frequency signal transceivers 1101, where J<N.

Further, with respect to an operation of combining N signals into J (J<N) signals, this embodiment further provides a formula for calculating the J signals, which specifically is as follows:

$$m_i = \sum_{k=1}^{N} a_{i,k} \cdot n_k \quad (2)$$

where $m_i$ is a signal amplitude of a signal at an $i^{th}$ port of J; $a_{i,k}$ is a $k^{th}$ constant in a constant coefficient set of an $i^{th}$ signal of J, $n_k$ is a signal amplitude of a signal at a $k^{th}$ port of N, $0 \leq i \leq M-1$, $0 \leq k \leq N-1$, and $m_i$, $a_{i,k}$, and $n_k$ are complex numbers. When $a_{i,k}$ and $n_k$ are known, a signal amplitude of each signal of the J signals may be calculated according to formula (2).

Alternatively, a 1-to-N switch may be added to the digital circuit 1102, where the switch may sample and train the second analog signal in a round-robin manner. The round-robin solution may reduce multiple first ADCs and radio frequency cables; however, a response to pre-distortion is slowed down.

In a fifth manner of receiving a second analog signal, the digital circuit 1102 includes a DPD interface, a first ADC, and a switch, where the DPD interface is connected to an output end of the first ADC, an input end of the first ADC is connected to an output end of the switch, and N input ends of the switch are separately connected to output ends of pre-distortion circuits 102 in N radio frequency signal transceivers 1101; or in a sixth manner of receiving a second analog signal, the digital circuit 1102 includes a DPD interface, a first ADC, a switch, a second up-frequency conversion circuit, and a first LO, where the DPD interface is connected to an output end of the first ADC, an input end of the first ADC is connected to an output end of the second up-frequency conversion circuit, a local oscillation input end of the second up-frequency conversion circuit is connected to a local oscillation output end of the first LO, an input end of the second up-frequency conversion circuit is connected to an output end of the switch, and N input ends of the switch are separately connected to output ends of pre-distortion circuits 102 in N radio frequency signal transceivers 1101.

In this embodiment, a down-frequency conversion operation may be performed on the third analog signal, or no down-frequency conversion operation is performed on the third analog signal. When the down-frequency conversion operation is performed on the third analog signal, the down-frequency conversion circuit on the third analog signal may be added to the receiving circuit 103 of the radio frequency signal transceiver 1101, or a down-frequency conversion circuit may be integrated into the digital circuit 1102.

In a first manner of receiving a third analog signal, the digital circuit 1102 includes a CPRI and a second ADC, where the CPRI is connected to output ends of N second ADCs, and input ends of the N second ADCs are separately connected to output ends of receiving circuits 103 in N radio frequency signal transceivers 1101; or in a second manner of receiving a third analog signal, the digital circuit 1102 includes a CPRI, a second ADC, a down-frequency conversion circuit, and a second LO, where the CPRI is connected to output ends of N second ADCs, input ends of the N second ADCs are separately connected to output ends of N down-frequency conversion circuits, local oscillation input ends of the N down-frequency conversion circuits are connected to a local oscillation output end of the second LO, and input ends of the N down-frequency conversion circuits are separately connected to output ends of receiving circuits 103 in N radio frequency signal transceivers 1101.

The second LO has only one local oscillation output end, and the local oscillation input ends of the N down-frequency conversion circuits are all connected to the local oscillation output end, so as to perform the down-frequency conversion operation on the third analog signal.

Alternatively, third analog signals of different frequency bands that are sent by the radio frequency signal transceiver 1101 may be received using a combiner, so as to save second ADCs and radio frequency cables in the digital circuit 1102.

In a third manner of receiving a third analog signal, the digital circuit 1102 includes a CPRI, a second ADC, and a third combiner, where the CPRI is connected to output ends of K second ADCs, input ends of the K second ADCs are connected to K output ends of the third combiner, and N input ends of the third combiner are separately connected to output ends of receiving circuits 103 in N radio frequency signal transceivers 1101, where K<N; or in a fourth manner of receiving a third analog signal, the digital circuit 1102 includes a CPRI, a second ADC, a third combiner, a down-frequency conversion circuit, and a second LO, where the CPRI is connected to output ends of K second ADCs, input ends of the K second ADCs are separately connected to output ends of K down-frequency conversion circuits, local oscillation input ends of the K down-frequency conversion circuits are connected to a local oscillation output end of the second LO, input ends of the K down-frequency conversion circuits are separately connected to K output ends of the third combiner, and N input ends of the third combiner are separately connected to output ends of receiving circuits 103 in N radio frequency signal transceivers 1101, where K<N.

Further, with respect to an operation of combining N signals into K (K<N) signals, this embodiment may further calculate a signal amplitude of each signal of the K signals according to formula (2), where reference may be made to the specific description of formula (2), and is not described repeatedly herein.

Figure 12:
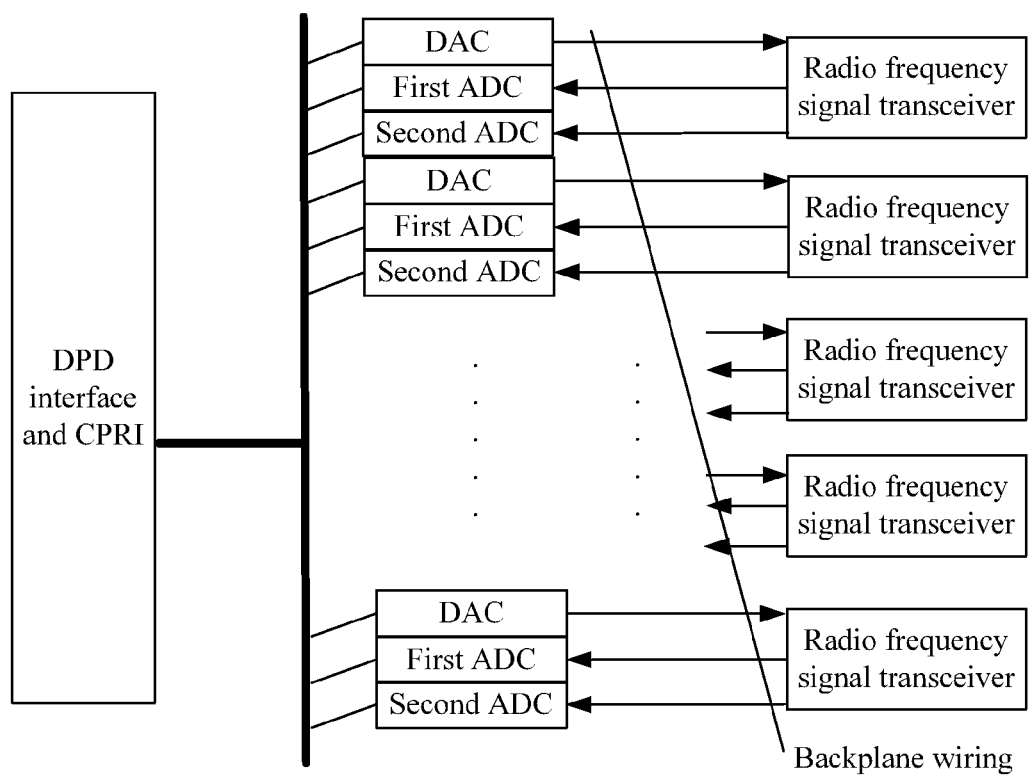
FIG. 12 is a schematic structural diagram of a second type of radio remote unit according to Embodiment 3 of the present disclosure.
Figure 13:
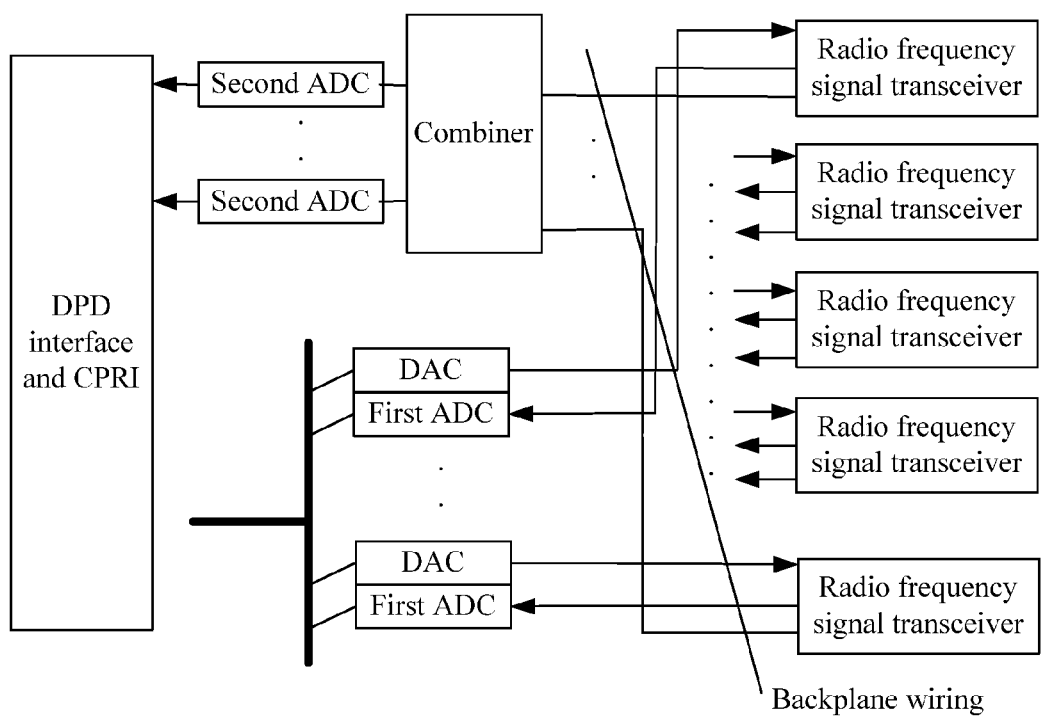
FIG. 13 is a schematic structural diagram of a third type of radio remote unit according to Embodiment 3 of the present disclosure.
Figure 14:
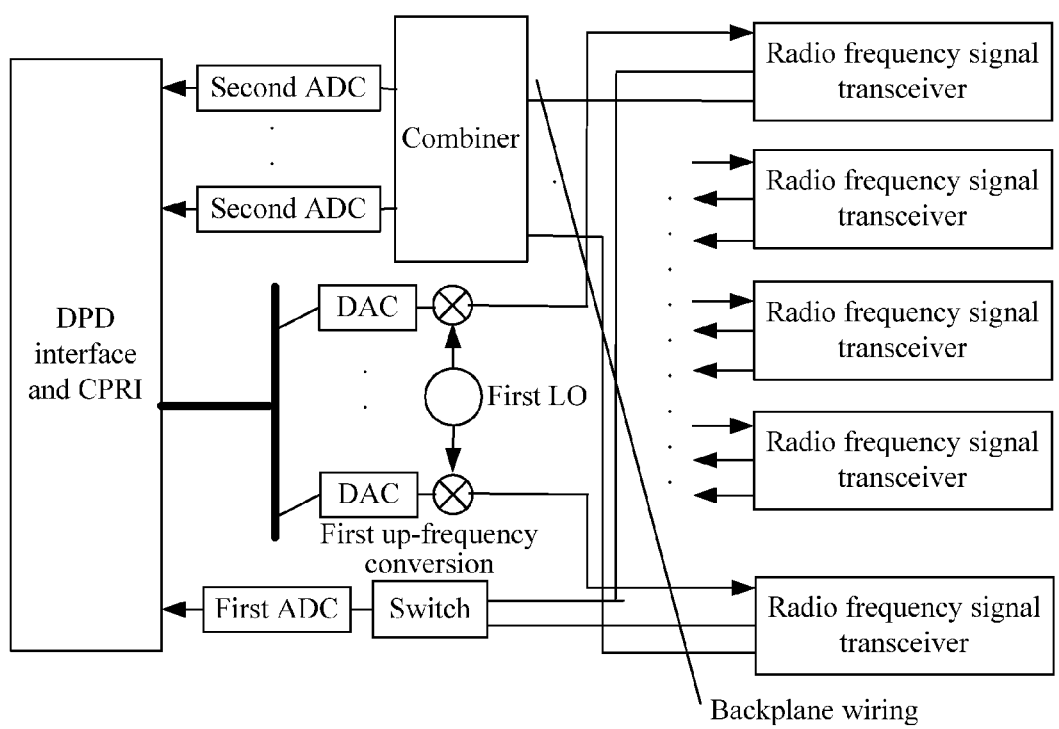
FIG. 14 is a schematic structural diagram of a fourth type of radio remote unit according to Embodiment 3 of the present disclosure.
Figure 15:
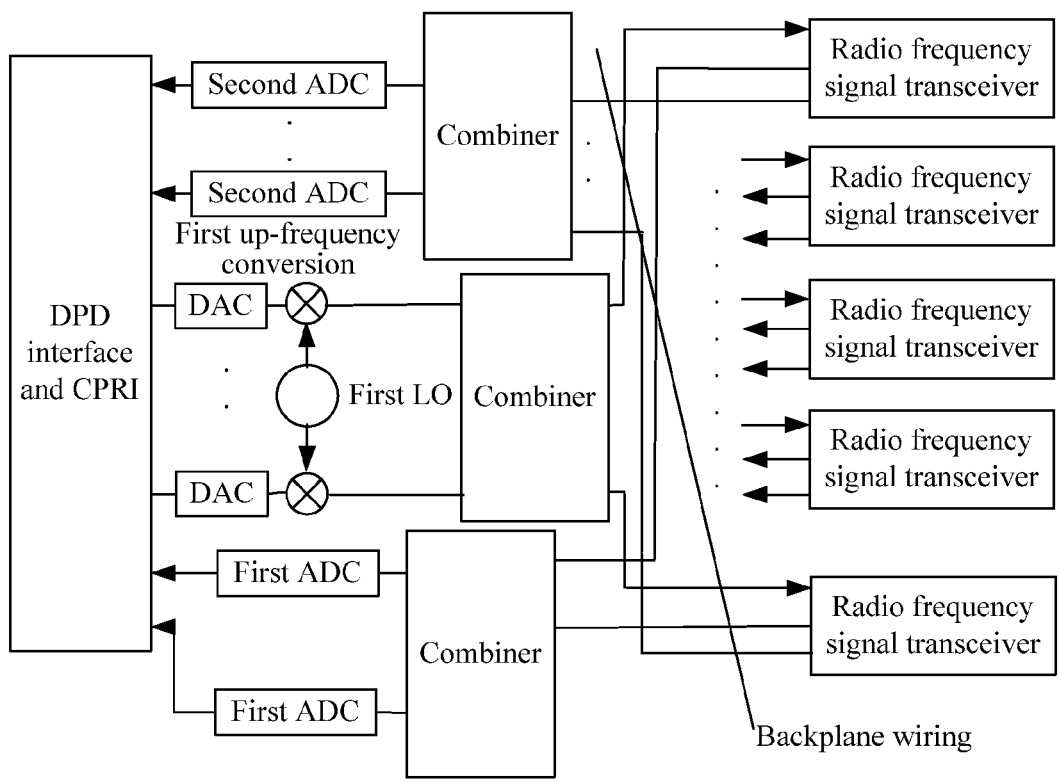
FIG. 15 is a schematic structural diagram of a fifth type of radio remote unit according to Embodiment 3 of the present disclosure.

The RRU in this embodiment may be a combination by selecting any one of the four manners of transmitting a first analog signal, any one of the six manners of receiving a second analog signal, and any one of the four manners of receiving a third analog signal. For example, a combination may be made by selecting the first manner of transmitting a first analog signal, the first manner of receiving a second analog signal, and the first manner of receiving a third analog signal. In addition, reference may be made to a schematic structural diagram of a first type of RRU shown in FIG. 12; a combination may also be made by selecting the first manner of transmitting a first analog signal, the first manner of receiving a second analog signal, and the third manner of receiving a third analog signal, and reference may be made to a schematic structural diagram of a second type of RRU shown in FIG. 13; a combination may also be made by selecting the second manner of transmitting a first analog signal, the fifth manner of receiving a second analog signal, and the third manner of receiving a third analog signal, and reference may be made to a schematic structural diagram of a third RRU shown in FIG. 14; and a combination may also be made by selecting the fourth manner of transmitting a first analog signal, the third manner of receiving a second analog signal, and the third manner of receiving a third analog signal, and reference may be made to a schematic structural diagram of a fourth type of RRU shown in FIG. 15; and the like.

When the manners described above are used to implement an RRU, multiple radio frequency signal transceivers may be grouped, where each group correspondingly receives and transmits one type of radio frequency signal. That is, the RRU is set as a Multiple Input Multiple Output (MIMO) system, where the process is the prior art that is not described in this embodiment.

By converting at least one input first digital signal into the corresponding number of first analog signals, and outputting the corresponding number of first analog signals to the corresponding number of radio frequency signal transceivers; converting a second analog signal output by at least one radio frequency signal transceiver into the corresponding number of second digital signals, and outputting the corresponding number of second digital signals, where the second analog signal is used to feedback distortion of the first analog signal so as to compensate the first analog signal in advance according to the distortion; and converting a third analog signals output by at least one radio frequency signal transceiver into the corresponding number of third digital signals, and outputting the corresponding number of third digital signals, the RRU according to this embodiment can transmit an analog signal between a digital circuit and a radio frequency signal transceiver, where an analog signal has low requirements on transmission, which may reduce a cost of a base station system and reduce a difficulty in implementing the base station system.

Embodiment 4

Figure 16:
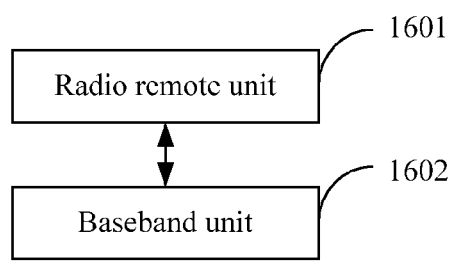
FIG. 16 is a schematic structural diagram of a base station system according to Embodiment 4 of the present disclosure.

Referring to FIG. 16, this embodiment provides a base station system, where the system includes a radio remote unit (RRU) 1601 and a baseband unit (BBU) 1602.

The BBU 1602 is configured to output at least one first digital signal to the RRU 1601, so that the RRU 1601 converts the first digital signal into a first analog signal and wirelessly transmits the first analog signal; receive at least one second digital signal output by the RRU 1601, where the second digital signal is obtained after the RRU 1601 converts the first analog signal, and is used to feedback distortion of the first analog signal so as to compensate the first analog signal in advance according to the distortion; and receive at least one third digital signal output by the RRU 1601, where the third digital signal is obtained after the RRU 1601 converts a wirelessly received third analog signal.

Preferentially, the RRU 1601 may be the RRU according to Embodiment 3 or Embodiment 5.

Figure 17:
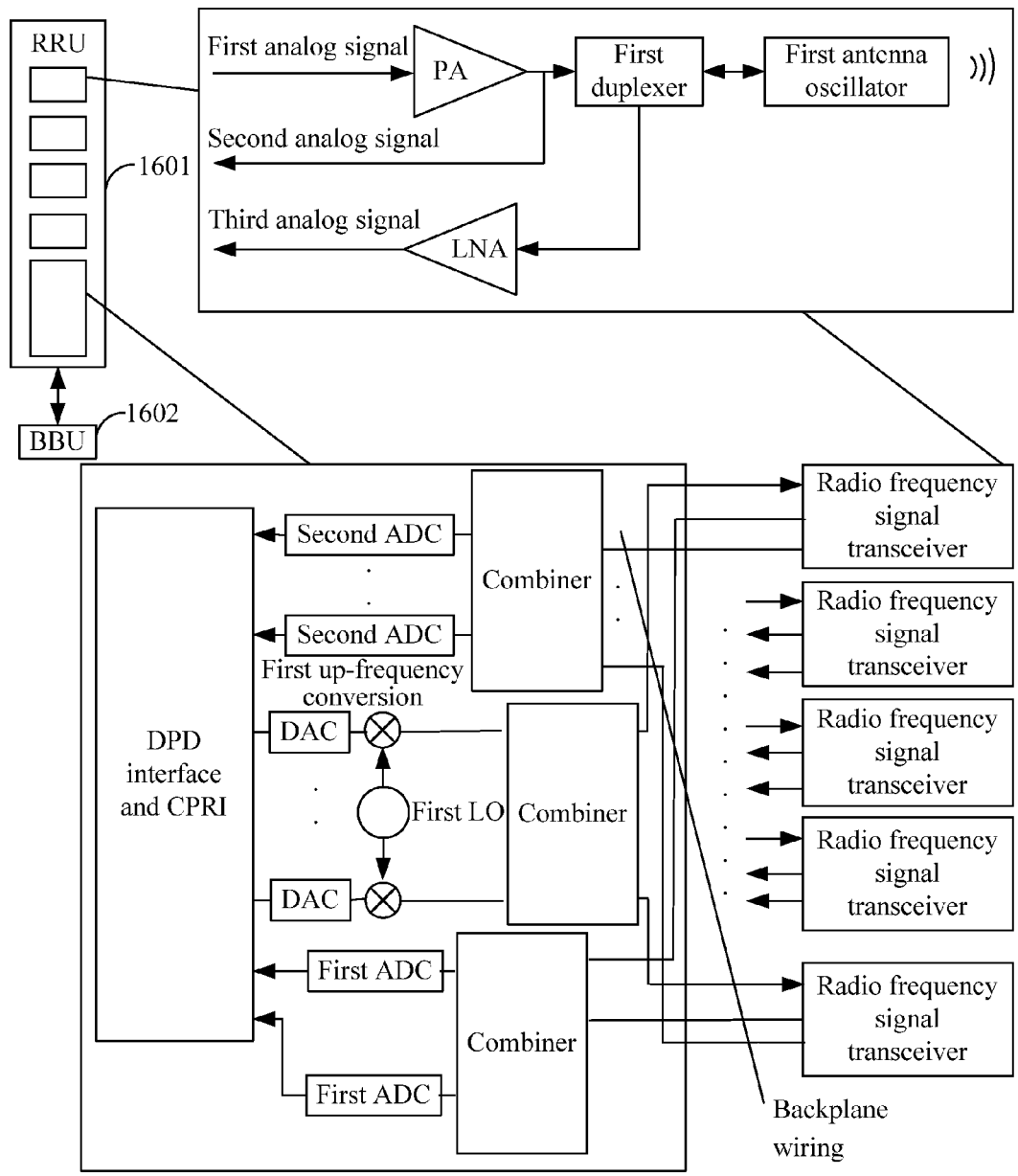
FIG. 17 is another schematic structural diagram of a base station system according to Embodiment 4 of the present disclosure.

Referring to a schematic structural diagram of a base station system shown in FIG. 17, the RRU 1601 is connected to the BBU 1602, where the RRU 1601 includes a digital circuit 1102 and at least one radio frequency signal transceiver 1101. The RRU 1601 may be any RRU in Embodiment 3. The radio frequency signal transceiver 1101 may be any one radio frequency signal transceiver in Embodiment 2, where the first type of radio frequency signal transceiver is used as an example.

The base station system according to this embodiment, by wirelessly transmitting the first analog signal after power amplification, wirelessly receiving the third analog signal, and processing and outputting the third analog signal, can wirelessly transmit the first analog signal and wirelessly receive the third analog signal, which avoids a radio frequency cable loss caused by resistor heating of the radio frequency cable itself when the radio frequency cable is used to transmit the first analog signal and the radio frequency cable is used to receive the third analog signal, thereby improving efficiency in receiving and transmitting a radio frequency signal; moreover, an analog signal has low requirements on transmission, a cost of the base station system may be reduced by transmitting the first analog signal, the second analog signal, and the third analog signal, thereby reducing a difficulty in implementing the base station system.

Embodiment 5

Figure 18:
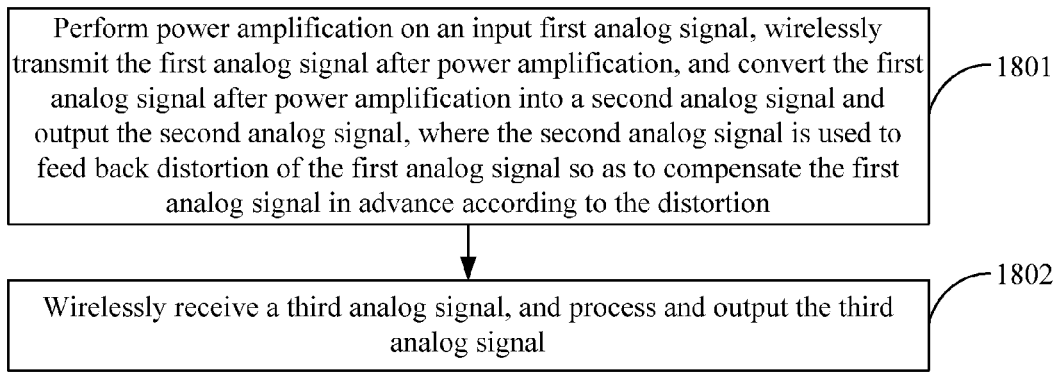
FIG. 18 is a flowchart of a radio frequency signal transceiving method according to Embodiment 5 of the present disclosure.

Referring to FIG. 18, this embodiment provides a radio frequency signal transceiving method, where the method includes:

1801: Perform power amplification on an input first analog signal, wirelessly transmit the first analog signal after power amplification, and convert the first analog signal after power amplification into a second analog signal and output the second analog signal, where the second analog signal is used to feedback distortion of the first analog signal so as to compensate the first analog signal in advance according to the distortion.

1802: Wirelessly receive a third analog signal, and process and output the third analog signal.

This embodiment may execute any one step of step 1801 and step 1802. When step 1801 and step 1802 are executed, this embodiment sets no limit to an execution sequence of step 1801 and step 1802.

Before the performing power amplification on a first analog signal, the method further includes performing an up-frequency conversion operation on the first analog signal; and/or performing a phase shifting operation on the first analog signal.

After the converting the first analog signal after power amplification into a second analog signal, the method further includes performing an up-frequency conversion operation on the second analog signal.

After the wirelessly receiving a third analog signal, the method further includes: performing a down-frequency conversion operation on the third analog signal; and/or performing a phase shifting operation on the third analog signal.

In the method according to this embodiment, power amplification is performed on the input first analog signal, the first analog signal after power amplification is wirelessly transmitted, the third analog signal is wirelessly received, and the third analog signal is processed and output, so that the first analog signal can be wirelessly transmitted and the third analog signal can be wirelessly received, which avoids a radio frequency cable loss caused by resistor heating of the radio frequency cable itself when the radio frequency cable is used to transmit the first analog signal and the radio frequency cable is used to receive the third analog signal, thereby improving efficiency in receiving and transmitting a radio frequency signal; moreover, an analog signal has low requirements on transmission, a cost of a base station system may be reduced by transmitting the first analog signal, the second analog signal, and the third analog signal, thereby reducing a difficulty in implementing the base station system.

Embodiment 6

Figure 19:
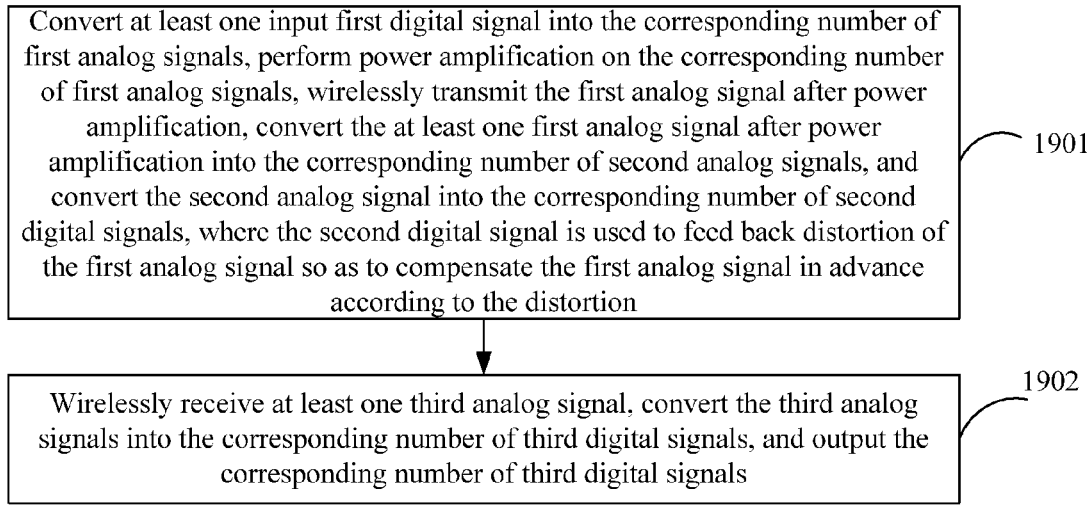
FIG. 19 is a flowchart of a radio frequency signal processing method according to Embodiment 6 of the present disclosure.

Referring to FIG. 19, this embodiment provides a radio frequency signal processing method, where the method includes:

1901: Convert at least one input first digital signal into the corresponding number of first analog signals, perform power amplification on the corresponding number of first analog signals, wirelessly transmit the first analog signal after power amplification, convert the at least one first analog signal after power amplification into the corresponding number of second analog signals, and convert the second analog signals into the corresponding number of second digital signals, where the second digital signal is used to feedback distortion of the first analog signal so as to compensate the first analog signal in advance according to the distortion.

1902: Wirelessly receive at least one third analog signal, convert the third analog signal into the corresponding number of third digital signals, and output the corresponding number of third digital signals.

This embodiment may execute any one step of step 1901 and step 1902. When step 1901 and step 1902 are executed, this embodiment sets no limit to an execution sequence of step 1901 and step 1902.

Before the performing power amplification on the corresponding number of first analog signals, the method further includes performing an up-frequency conversion operation on the first analog signal; and/or combining the first analog signal.

Before the converting the second analog signal into the corresponding number of second digital signals, the method further includes performing an up-frequency conversion operation on the second analog signal; and/or combining the second analog signal.

Before the converting the third analog signal into the corresponding number of third digital signals, the method further includes performing a down-frequency conversion operation on the third analog signal; and/or combining the third analog signal.

In the method according to this embodiment, at least one input first digital signal is converted into the corresponding number of first analog signals, power amplification is performed on the corresponding number of first analog signals, and the first analog signal after power amplification is wirelessly transmitted; at least one third analog signal is wirelessly received, the third analog signal is converted into the corresponding number of third digital signals, and the corresponding number of third digital signals are output, so that the first analog signal can be wirelessly transmitted and the third analog signal can be wirelessly received, which avoids a radio frequency cable loss that is caused by heating of a resistor of the radio frequency cable itself when the radio frequency cable is used to transmit the first analog signal and receive the third analog signal, so as to improve efficiency in receiving and transmitting a radio frequency signal; moreover, an analog signal has low requirements on transmission, hence a cost of a base station system can be reduced by transmitting the first analog signal, the second analog signal, and the third analog signal can reduce, thereby reducing a difficulty in implementing the base station system.

It should be noted that, when the radio frequency signal transceiver, the radio remote unit, and the base station system according to the foregoing embodiments are used to receive, transmit, and process a radio frequency signal, the division of the functional modules are used merely as an example for description. In an actual application, the functions may be assigned to different functional modules according to requirements. That is, internal structures of the radio frequency signal transceiver, the radio remote unit, and the base station system are divided into different functional modules for completing all or partial functions described above. In addition, the radio frequency signal transceiver, the radio remote unit, the base station system according to the embodiments described above belong to the same idea as the embodiments of the radio frequency signal transceiving and processing method, where specific implementation manner processes thereof may be referenced to the method embodiments, and are not described repeatedly herein.

The serial numbers of the foregoing embodiments of the present disclosure are used merely for description, and do not represent priority of the embodiments.

A person of ordinary skill in the art may understand that all or a part of the steps of the foregoing embodiments may be implemented by hardware, or may be implemented by a program instructing relevant hardware. The program may be stored in a computer readable storage medium. The storage medium may be a read-only memory, a magnetic disc, or an optical disc.

The foregoing descriptions are merely exemplary embodiments of the present disclosure, but are not intended to limit the present disclosure. Any modification, equivalent replacement, or improvement made within the spirit and principle of the present disclosure shall fall within the protection scope of the present disclosure.

What is claimed is:

1. A radio remote unit (RRU), comprising:
    a digital circuit;
    a backplane; and
    at least one radio frequency signal transceiver configured to transmit an analog signal to the digital circuit via the backplane, wherein the radio frequency signal transceiver comprises;
        a pre-distortion circuit; and
        a transmission circuit coupled to the pre-distortion circuit and configured to:
            perform power amplification on an input first analog signal;
            wirelessly transmit the first analog signal after power amplification; and
            output the first analog signal after power amplification to the pre distortion circuit, wherein the pre-distortion circuit is configured to:
                convert the first analog signal after power amplification output by the transmission circuit into a second analog signal; and
                output the second analog signal, wherein the second analog signal is used to feedback distortion of the first analog signal to compensate the first analog signal in advance according to the distortion; and
        a receiving circuit configured to:
            wirelessly receive a third analog signal;
            process the third analog signal; and
            output the processed third analog signal,
    wherein the digital circuit is coupled to the at least one radio frequency signal transceiver and is configured to;
        convert at least one input first digital signal into a corresponding number of fourth analog signals; and
        output the corresponding number of fourth analog signals to a corresponding number of radio frequency signal transceivers;

convert a fifth analog signal output by at least one radio frequency signal transceiver into a corresponding number of second digital signals;

output the corresponding number of second digital signals, wherein the fifth analog signal is used to feedback distortion of one of the fourth analog signals to compensate the one fourth analog signal in advance according to the distortion;

convert a processed sixth analog signal output by at least one radio frequency signal transceiver into a corresponding number of third digital signals; and output the corresponding number of third digital signals, wherein the one fourth analog signal is the same as the first analog signal, wherein the second analog signal is the same as the fifth analog signal, and wherein the third analog signal is the same as the sixth analog signal.

2. The RRU according to claim 1, wherein the digital circuit comprises a common public radio interface (CPRI) and a digital-analog converter (DAC), wherein the CPRI is connected to input ends of N DACs, wherein output ends of the N DACs are separately connected to input ends of transmission circuits in N radio frequency signal transceivers, and wherein N is an integer.

3. The RRU according to claim 1, wherein the digital circuit comprises a common public radio interface (CPRI), a digital-analog converter (DAC), a first up-frequency conversion circuit, and a first local oscillator (LO), wherein the CPRI is connected to input ends of N DACs, wherein output ends of the N DACs are separately connected to input ends of N first up-frequency conversion circuits, wherein local oscillation input ends of the N first up-frequency conversion circuits are connected to a local oscillation output end of the first LO, wherein output ends of the N first up-frequency conversion circuits are separately connected to input ends of transmission circuits in N radio frequency signal transceivers, wherein N is an integer.

4. The RRU according to claim 1, wherein the digital circuit comprises a common public radio interface (CPRI), a digital-analog converter (DAC), and a first combiner, wherein the CPRI is connected to input ends of M DACs, wherein output ends of the M DACs are connected to M input ends of the first combiner, wherein N output ends of the first combiner are separately connected to input ends of transmission circuits in N radio frequency signal transceivers, wherein M and N are integers, and wherein M<N.

5. The RRU according to claim 1, wherein the digital circuit comprises a common public radio interface (CPRI), a digital-analog converter (DAC), a first combiner, a first up-frequency conversion circuit, and a first local oscillator (LO), wherein the CPRI is connected to input ends of M DACs, wherein output ends of the M DACs are separately connected to input ends of M first up-frequency conversion circuits, wherein local oscillation input ends of the M first up-frequency conversion circuits are connected to a local oscillation output end of the first LO, wherein output ends of the M first up-frequency conversion circuits are separately connected to M input ends of the first combiner, wherein N output ends of the first combiner are separately connected to input ends of transmission circuits N radio frequency signal transceivers, wherein M and N are integers, and wherein M<N.

6. The RRU according to claim 1, wherein the digital circuit comprises a digital pre-distortion (DPD) interface and a first analog-digital converter (ADC), wherein the DPD interface is connected to output ends of N first ADCs, wherein input ends of the N first ADCs are separately connected to output ends of pre-distortion circuits in N radio frequency signal transceivers, and wherein N is an integer.

7. The RRU according to claim 1, wherein the digital circuit comprises a digital pre-distortion (DPD) interface, a first analog-digital converter (ADC), a second up-frequency conversion circuit, and a first local oscillator (LO), wherein the DPD interface is connected to output ends of N first ADCs, wherein input ends of the N first ADCs are separately connected to output ends of N second up-frequency conversion circuits, wherein local oscillation input ends of the N second up-frequency conversion circuits are connected to a local oscillation output end of the first LO, wherein input ends of the N second up-frequency conversion circuits are separately connected to output ends of pre-distortion circuits in N radio frequency signal transceivers, and wherein N is an integer.

8. The RRU according to claim 1, wherein the digital circuit comprises a digital pre-distortion (DPD) interface, a first analog-digital converter (ADC), and a second combiner, wherein the DPD interface is connected to output ends of J first ADCs, wherein input ends of the J first ADCs are connected to J output ends of the second combiner, and wherein N input ends of the second combiner are separately connected to output ends of pre-distortion circuits in N radio frequency signal transceivers, wherein J and N are integers, and wherein J<N.

9. The RRU according to claim 1, wherein the digital circuit comprises a digital pre-distortion (DPD) interface, a first analog-digital converter (ADC), a second combiner, a second up-frequency conversion circuit, and a first local oscillator (LO), wherein the DPD interface is connected to output ends of J first ADCs, wherein input ends of the J first ADCs are separately connected to output ends of J second up-frequency conversion circuits, wherein local oscillation input ends of the J second up-frequency conversion circuits are connected to a local oscillation output end of the first LO, wherein input ends of the J second up-frequency conversion circuits are separately connected to J output ends of the second combiner, and wherein N input ends of the second combiner are separately connected to output ends of pre-distortion circuits in N radio frequency signal transceivers, wherein J and N are integers, and wherein J<N.

10. The RRU according to claim 1, wherein the digital circuit comprises a digital pre-distortion (DPD) interface, a first analog-digital converter (ADC), and a switch, wherein the DPD interface is connected to an output end of the first ADC, wherein an input end of the first ADC is connected to an output end of the switch, wherein N input ends of the switch are separately connected to output ends of pre-distortion circuits in N radio frequency signal transceivers, and wherein N is an integer.

11. The RRU according to claim 1, wherein the digital circuit comprises a digital pre-distortion (DPD) interface, a first analog-digital converter (ADC), a switch, a second up-frequency conversion circuit, and a first local oscillator (LO), wherein the DPD interface is connected to an output end of the first ADC, wherein an input end of the first ADC is connected to an output end of the second up-frequency conversion circuit, wherein a local oscillation input end of the second up-frequency conversion circuit is connected to a local oscillation output end of the first LO, wherein an input end of the second up-frequency conversion circuit is connected to an output end of the switch, wherein N input ends of the switch are separately connected to output ends of pre-distortion circuits in N radio frequency signal transceivers, and wherein N is an integer.

12. The RRU according to claim 1, wherein the digital circuit comprises a common public radio interface (CPRI) and a second analog-digital converter (ADC), wherein the CPRI is connected to output ends of N second ADCs, and wherein input ends of the N second ADCs are separately connected to output ends of receiving circuits in N radio frequency signal transceivers, and wherein N is an integer.

13. The RRU according to claim 1, wherein the digital circuit comprises a common public radio interface (CPRI), a second analog-digital converter (ADC), a do frequency conversion circuit, and a second local oscillator (LO), wherein the CPRI is connected to output ends of N second ADCs, wherein input ends of the N second ADCs are separately connected to output ends of N down-frequency conversion circuits, wherein local oscillation input ends of the N down-frequency conversion circuits are connected to a local oscillation output end of the second LO, wherein input ends of the N down-frequency conversion circuits are separately connected to output ends of receiving circuits in N radio frequency signal transceivers, and wherein N is an integer.

14. The RRU according to claim 1, wherein the digital circuit comprises a common public radio interface (CPRI), a second analog-digital converter (ADC), and a third combiner, wherein the CPRI is connected to output ends of K second ADCs, wherein input ends of the K second ADCs are connected to K output ends of the third combiner, wherein N input ends of the third combiner are separately connected to output ends of receiving circuits in N radio frequency signal transceivers, wherein K and N are integers, and wherein K<N.

15. The RRU according to claim 1, wherein the digital circuit comprises a common public radio interface (CPRI), a second analog-digital converter (ADC), a third combiner, a down-frequency conversion circuit, and a second local oscillator (LO), wherein the CPRI is connected to output ends of K second ADCs, wherein input ends of the K second ADCs are separately connected to output ends of K down-frequency conversion circuits, wherein local oscillation input ends of the K down-frequency conversion circuits are connected to a local oscillation output end of the second LO, wherein input ends of the K down-frequency conversion circuits are separately connected to K output ends of the third combiner, wherein N input ends of the third combiner are separately connected to output ends of receiving circuits in N radio frequency signal transceivers, wherein K and N are integers, and wherein K<N.

16. A base station system comprising:
a radio remote unit (RRU), comprising:
  a digital circuit;
  a backplane; and
  at least one radio frequency signal transceiver configured to transmit an analog signal to the digital circuit via the backplane, wherein the radio frequency signal transceiver comprises:
    a pre-distortion circuit; and
    a transmission circuit coupled to the pre-distortion circuit and configured to:
      perform power amplification on an input first analog signal;
      wirelessly transmit the first analog signal after power amplification; and
      output the first analog signal after power amplification to the pre-distortion circuit;

wherein the pre-distortion circuit is configured to:
  convert the first analog signal after power amplification output by the transmission circuit into a second analog signal; and
  output the second analog signal, wherein the second analog signal is used to feedback distortion of the first analog signal to compensate the first analog signal in advance according to the distortion; and
a receiving circuit configured to:
  wirelessly receive a third analog signal;
  process the third analog signal; and
  output the processed third analog signal,
wherein the digital circuit is coupled to the at least one radio frequency signal transceiver and is configured to:
  convert at least one input first digital signal into a corresponding number of fourth analog signals; and
  output the corresponding number of fourth analog signals to a corresponding number of radio frequency signal transceivers;
  convert a fifth analog signal output by at least one radio frequency signal transceiver into a corresponding number of second digital signals;
  output the corresponding number of second digital signals, wherein the fifth analog signal is used to feedback distortion of one of the fourth analog signals to compensate the one fourth analog signal in advance according to the distortion;
  convert a processed sixth analog signal output by at least one radio frequency signal transceiver into a corresponding number of third digital signals; and
  output the corresponding number of third digital signals; and
a baseband unit (BBU) coupled to the RRU and configured to:
  output at least one first digital signal to the RRU so that the RRU converts the first digital signal into a first analog signal and wirelessly transmits the first analog signal;
  receive at least one second digital signal output by the RRU, wherein the second digital signal is obtained after the RRU converts the first analog signal and is used to feedback distortion of the first analog signal to compensate the first analog signal in advance according to the distortion; and
  receive at least one third digital signal output by the RRU, wherein the third digital signal is obtained after the RRU converts a wirelessly received third analog signal,
wherein the one fourth analog signal is the same as the first analog signal,
wherein the second analog signal is the same as the fifth analog signal,
wherein the third analog signal is the same as the sixth analog signal.

17. A radio remote unit (RRU), comprising:
a digital circuit;
a backplane; and
at least one radio frequency signal transceiver configured to transmit an analog signal to the digital circuit via the backplane, wherein the radio frequency signal transceiver comprises:

a pre-distortion circuit; and
a transmission circuit coupled to the pre-distortion circuit and configured to:
  perform power amplification on an input first analog signal;
  wirelessly transmit the first analog signal after power amplification; and
  output the first analog signal after power amplification to the pre-distortion circuit, wherein the pre-distortion is configured to:
    convert the first analog signal after power amplification output by the transmission circuit into a second analog signal; and
    output the second analog signal, wherein the second analog signal is used to feedback distortion of the first analog signal to compensate the first analog signal in advance according to the distortion; and
a receiving circuit configured to:
  wirelessly receive a third analog signal;
  process e third analog signal; and
  output the processed third analog signal,
wherein the digital circuit is coupled to the at least one radio frequency signal transceiver and is configured to:
  convert at least one input first digital signal into a corresponding number of fourth analog signals; and
  output the corresponding number of fourth analog signal to a corresponding number of radio frequency signal transceivers;
  convert a fifth analog signal output by at least one radio frequency signal transceiver into a corresponding number of second digital signals;
  output the corresponding number of second digital signals, wherein the fifth analog signal is used to feedback distortion of one of the fourth analog signals to compensate the one fourth analog signal in advance according to the distortion;
  convert a processed sixth analog signal output by at least one radio frequency signal transceiver into a corresponding number of third digital signals; and
output the corresponding number of third digital signals; and
  wherein the one fourth analog signal is processed to generate the first analog signal,
  wherein the second analog signal is processed to generate the fifth analog signal, and
  wherein the third analog signal is processed to generate the sixth analog signal.

* * * * *